United States Patent [19]

Miyaoka et al.

[11] Patent Number: 4,947,447
[45] Date of Patent: Aug. 7, 1990

[54] METHOD FOR DATA CODING

[75] Inventors: Shinichiro Miyaoka, Kawasaki; Takayoshi Shiraishi, Chigasaki; Ryoichi Sasaki, Fujisawa, all of Japan

[73] Assignee: Hitachi, Ltd., Tokyo, Japan

[21] Appl. No.: 42,366

[22] Filed: Apr. 24, 1987

[30] Foreign Application Priority Data

| Apr. 24, 1986 | [JP] | Japan | 61-96054 |
| May 30, 1986 | [JP] | Japan | 61-123322 |
| Jun. 2, 1986 | [JP] | Japan | 61-125788 |
| Dec. 24, 1986 | [JP] | Japan | 61-306416 |

[51] Int. Cl.$^5$ ............................................. G06K 9/36
[52] U.S. Cl. ...................................... 382/56; 358/433
[58] Field of Search ............ 382/41, 51, 53, 56; 358/133, 135, 260, 261.2, 261.4, 262.1, 433

[56] References Cited

U.S. PATENT DOCUMENTS

| 4,319,267 | 3/1982 | Mitsuya et al. | 358/433 |
| 4,409,623 | 10/1983 | Kobayashi et al. | 358/433 |
| 4,567,519 | 1/1986 | Richard | 358/135 |
| 4,682,300 | 7/1987 | Seto et al. | 382/54 |
| 4,691,329 | 9/1987 | Juri et al. | 382/56 |
| 4,710,811 | 12/1987 | Kondo | 358/260 |
| 4,751,742 | 6/1988 | Meeker | 382/56 |
| 4,757,552 | 7/1988 | Asano et al. | 382/56 |
| 4,764,975 | 8/1988 | Inoue | 382/56 |
| 4,772,947 | 9/1988 | Kono | 382/56 |
| 4,788,598 | 11/1988 | Ochi et al. | 382/56 |

Primary Examiner—Leo H. Boudreau
Assistant Examiner—Jose L. Couso
Attorney, Agent, or Firm—Antonelli, Terry, Stout & Kraus

[57] ABSTRACT

Numerical data in a two-dimensional distribution for encoding picture data or voice data at high efficiency is divided into blocks being not equal in length depending on an amount of variation of each numeric data. The numeric data within the divided blocks is converted into data corresponding to an apex of each block, and the converted data is encoded into tree-structure data. Image data is divided into blocks being not equal in length depending on amount of variation of brightness, and the brightness within the divided blocks is converted into data corresponding to an apex of each block, and the converted data is encoded into tree-structure data. Range of values to be taken by data is divided into a range of normal values and a range of abnormal values, and a short bit number is assigned to the quantizing level in the range of normal values and a long bit number is assigned to quantizing level of other data, thereby the variable length coding at two steps is performed.

2 Claims, 22 Drawing Sheets

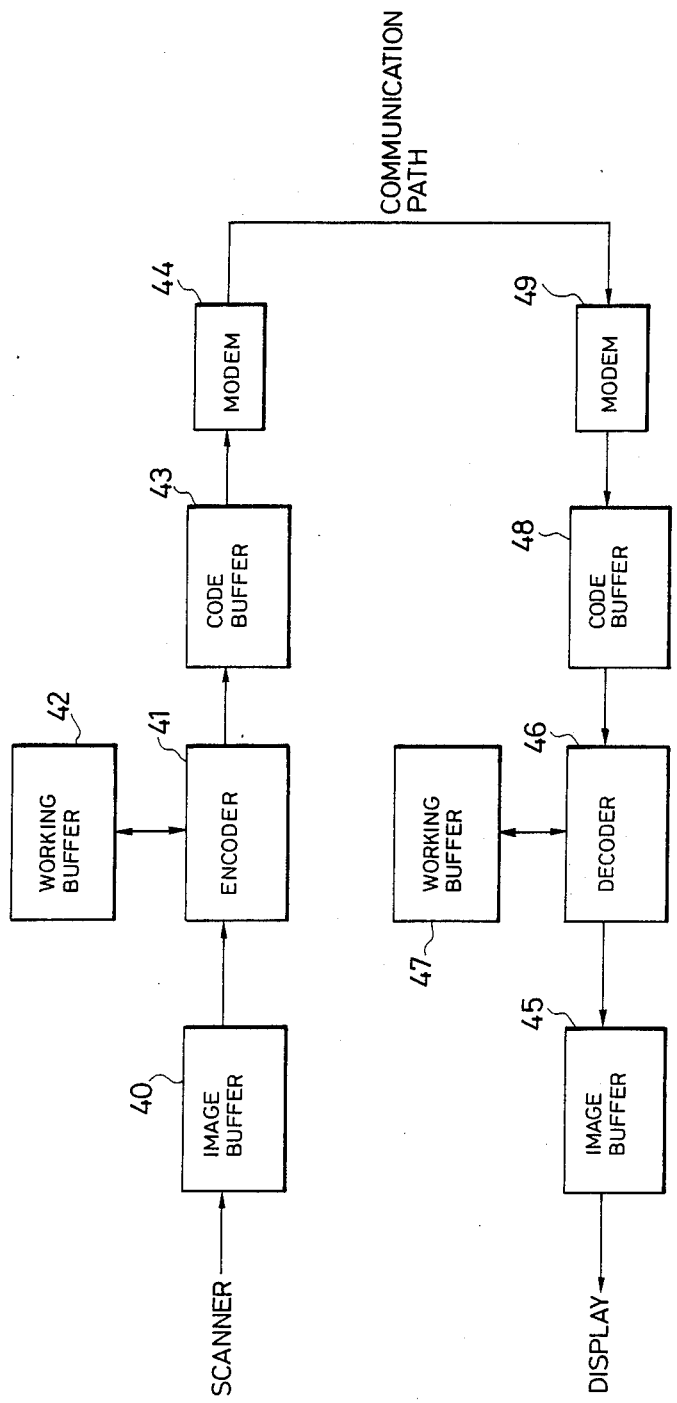

| COEFFICIENT / LEVEL | A | B | C | D |
|---|---|---|---|---|
| 1 | | | | |
| 2 | | | | |
| 3 | | | | |
| 4 | | | | |

| 1 | 2 |
|---|---|
| 3 | 4 |

FIG. 21(a)
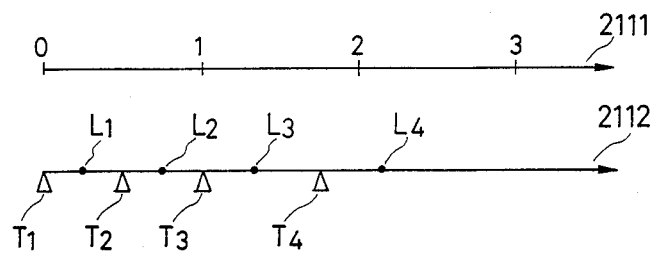
FIG. 21(b)
| LEVEL | CODE |
|---|---|
| L1 | S00 |
| L2 | S01 |
| L3 | S10 |
| L4 | S11 |
FIG. 22(a)
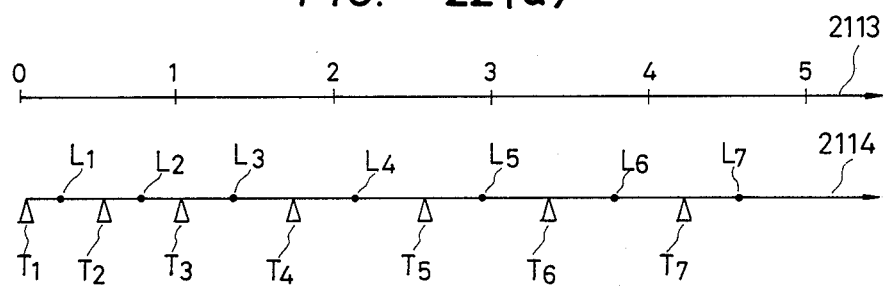
FIG. 22(b)
| LEVEL | CODE |
|---|---|
| L1 | S00 |
| L2 | S01 |
| L3 | S10 |
| L4 | S1100 |
| L5 | S1101 |
| L6 | S1110 |
| L7 | S1111 |

FIG. 31(a)
$$\sigma = \begin{pmatrix} 1 & 2 & 3 & 4 \\ 3 & 1 & 4 & 2 \end{pmatrix}$$
FIG. 31(b)
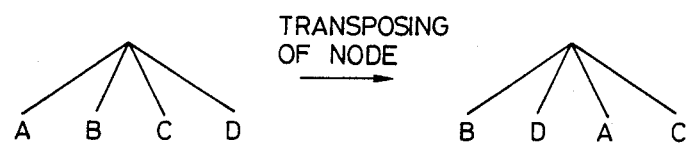
FIG. 31(c)
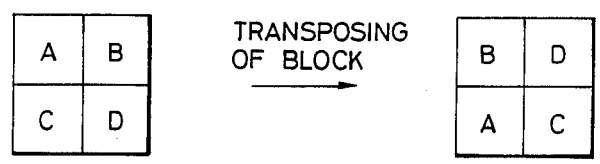

METHOD FOR DATA CODING

BACKGROUND OF THE INVENTION

The present invention relates to methods for video data coding, and more particularly to a method for data coding, which is favorable for video communication at low bit rate, outline picture image forming for storage and retrieval of picture image file, and further for coding system to code video data or voice data with abnormal value generation efficiently according to probability distribution.

Methods for data coding in the prior art are roughly classified into predictive coding method and transform coding method.

In the predictive coding method, brightness values of a picture element as unit is predicted from an adjacent picture element, and the predicted value is subjected to variable length coding or quantized.

On the other hand, in the transform coding method, picture image is divided into blocks each having definite size ($8 \times 8$, $16 \times 16$ or the like being frequently used) and the block as unit is subjected to orthogonal transform and coded.

In this method, since global redundancy beyond the block size represented by the flat background or the like cannot be utilized, its compression ratio is limited.

Further, various methods such as vector quantizing method or block coding method are known as disclosed in Hosaka et.: "Comparison of Still Picture Coding Methods" (Electronic Communication Society Technical Paper IE83-106). Among these, as a method having particularly high compression performance, adaptive cosine transform encoding method being a sort of orthogonal transform encoding method is known. This method has problems in that not only the amount to be processed increases but also sharp line or edge (e.g., character or symbol on image of light and shade) fades in the decoded image. Also in vector quantizing method studied actively in recent years, since the image is divided into sub-blocks of definite size and quantizing is effected per block, similar limitation exists.

Further, in quantizing method disclosed in J.MAX: "Quantizing for Minimum Distortion" IRE Tr. on Information Theory (March, 1960), probability distribution is assumed regarding input signals, and quantizing level is determined so that quantizing distortion (quadratic error) becomes minimum with respect to the distribution. Gaussian distribution is frequently used as the probability distribution because such condition frequently occurs where the central limiting theorem (theorem that sum of N independent random variables in arbitrary distribution approaches the Gaussian distribution as N becomes large) can be applied. This method has problems in that when the distribution of input signals is shifted from the assumed probability distribution, for example, assuming the Gaussian distribution, when generation probability of abnormal value beyond $3\sigma$ ($\sigma$: standard deviation) increases to 1—several % from 0.3% being theoretical value, mean quantizing error increases abruptly.

The prior art as above described has problems in that, in the case of method with high compression performance such as orthogonal transform encoding or vector quantizing, the encoding/decoding processing amount increases and therefore the hardware cost increases, or time is required for decoding. In the case of method with simple processing such as prediction encoding or block encoding, the compression performance is deteriorated.

The above-mentioned adaptive cosine transform encoding method is disclosed in W. Chen, et al: "Adaptive Coding of Monochrome and Color Images" [IE[3] Vol. COM-25, 11(1977)]. In this method, since selective preservation of useful image information is not considered, if it is intended to increase the compression ratio, the useful image information will be emitted.

Finally, enciphering method suitable for the high efficiency encoding in the prior art will be described. Among the small number of articles already published, method disclosed in "Cipher Encoding System Utilizing Feature of Graphic Information" (Electronic Communication Society Technical Paper IE82-98) repeatedly applies the quadratic differentiation operation directly to the original image data. As a result, the obtained enciphering data becomes pattern with little redundancy in similar manner to noise. Consequently, this method is not suitable for the high efficiency encoding, and cost for the storage and transmission of the image data increases.

SUMMARY OF THE INVENTION

First object of the invention is to provide a data compression method which can suppress and compress not only the local redundancy of image but also the global redundancy.

Second object of the invention is to provide a high efficiency encoding method of image data, where high compression performance can be achieved by relatively simple encoding/decoding (particularly decoding as a problem in practice) processing, and fading in sharp line or edge can be avoided.

Third object of the invention is to provide a high efficiency encoding method, where the quantizing bit number is held in nearly the same degree as that in conventional method, and the method is robust to generation of the abnormal value, that is, the quantizing can be effected without increasing the quantizing error.

Fourth object of the invention is to provide a coding method, wherein information preservation is realized selectively to a specific region on the image which is judged as useful information and assigned by a man, and the high compression ratio can be achieved in the image as a whole.

Fifth object of the invention is to provide an image data enciphering method which is fitted well to a high efficiency coding method and can utilize advantages thereof sufficiently, and more particularly an image data enciphering method which is suitable for use under the high efficiency coding method such as called tree coding method or hierarchical coding method.

In order to attain the first object, in the invention, the image is divided into blocks being not equal in length corresponding to an amount of the brightness variation, and the brightness in each divided block is converted into data corresponding to apex of the block, and further the converted data is coded into tree-structure data.

Further, in order to increase the compression ratio utilizing the vision property of men, the coding bit number during coding the brightness data is made variable depending on size of the block.

The above-mentioned block dividing processing is performed so that the whole region is divided roughly at portion of gentle value variation and finely at portion of abrupt value variation into blocks being not equal in length. As a result, a flat region is assembled into a large block, and portion of abrupt value variation is divided into minimum unit. Describing this regarding a concrete image, the image is divided roughly at portion of the gentle brightness variation and finely at portion of the abrupt brightness variation into blocks being not equal in length. As a result, the flat background region is assembled into a large block, and the edge portion is divided into the picture element level.

Value of each block ("brightness" in the case of image) is approximated by a bi-linear function so that sum of error square values becomes minimum, and then coordinates at apex of each block are substituted in the bi-liner function so as to obtain data corresponding to the apex.

Next, using coding means into tree-structure data, spatial distribution of the block apex and corresponding value (brightness) are coded into tree-structure data.

Particularly, regarding processing of an image, means for making the coding bit number variable is installed, and utilizing the vision property that the sensitivity of eyes of men to the brightness is decreased at the edge portion, as the size of the block becomes small, ratio of the coding bit number to the brightness corresponding to the apex of the block is decreased, thereby the compression ratio is further improved.

Next, the second object can be attained in that the image data is divided into blocks being not equal in length (different size) so that distortion after encoding/decoding processing of each block becomes not more than the tolerable value, and the dividing structure of the block and the coding data thereof are coded into data formed in tree structure. Coding of the block can be realized, for example, by approximation of the brightness variation by the bi-linear function and quantizing of coefficients of the bi-linear function.

Also, the third object can be attained in that range of values to be taken by the input signals is divided into range of normal values (e.g., not more than $3\sigma$) and range of abnormal values (e.g., not less than $3\sigma$), and assuming different probability distribution to each range the optimum quantizing level and the threshold value for the level judging are set, and the short bit number is assigned to the quantizing level in range of normal value and the long bit number is assigned to the quantizing level in range of abnormal value thereby the variable length coding at two step is performed.

As a result of dividing into blocks being not equal in length, portion of the gentle brightness variation is block-divided roughly and portion of the abrupt brightness variation block-divided finely. Since an image of light and shade usually contains portion of the gentle brightness variation much, almost portion is block-divided roughly. Since each block is coded by four coefficients of the bi-linear function irrespective of its size, when portion block-divided roughly increases, amount of coded data decreases and the compression ratio is improved. Thinking distortion (mean distortion) per one picture element, it follows that the smaller the block the larger the mean distortion. This is effective in both aspects, fitting to the human sight property and improvement of the compression performance. Data formed in tree structure can express the block dividing structure using the little bit amount, and overhead in the decoding processing becomes little.

According to the variable length coding of two steps of the invention, when input signals are in range of normal values, quantizing is performed at the same accuracy and bit number as those in a conventional quantizer. When input signal takes abnormal value, quantizing is performed using quantizing level newly set to the abnormal value, thereby the quantizing error to the abnormal value decreases. The quantizing code to the abnormal value is assigned with the bit number longer than that to the normal value, but increase of the mean quantizing bit number becomes negligible because the generation frequency of abnormal values is sufficiently small (several % at most) in comparison to that of normal values.

Further, the fourth object can be attained by providing means for assigning a specific region on the image, means for judging whether a specific picture element is inside or outside of the region, and means for setting the compression ratio controlling parameter values being different between inside and outside of the region.

Using the region assigning means, first, a man assigns the useful information existing region. The image is divided into small blocks, and the high efficiency coding is performed per each block. In this case, the above-mentioned discrimination means judges whether each block is inside or outside of the region. The parameter value setting means performs parameter setting, so that the compression ratio is decreased to blocks inside the region and increased to blocks outside the region. As a result, the compression ratio is decreased and the information preservation is performed selectively inside the region, and coding is performed so that the whole image has the high compression ratio.

Finally, the fifth object can be attained in that, after tree coding, hierarchical data block to the tree coding image data or transposing form of the data block group is assigned based on an enciphering key, and transposing in the assigned form is applied to the tree coding image data.

The tree coding image data has the hierarchical block structure corresponding to the tree structure. The enciphering key through the transposing form assigning step assigns the data block in respective hierarchical block structure or the transposing form of the block group, in the state of the enciphering key as it is or after definite transform processing. The transposing step according to the assignment performs the transposing (arrangement changing) of the data block in respective hierarchical structure or the block group to the tree coding image data. As a result, respective blocks of the original tree coding image data are moved in different positions as if they are shuffled, and when the tree deciphering is performed to the moved blocks as they are, the image quite different from the original image is produced thus the enciphering is achieved. The deciphering can be effected by applying transposing reverse to that in the enciphering in each stage.

BRIEF DESCRIPTION OF THE DRAWINGS

FIG. 9 is a constitution diagram of encoder/decoder;

FIG. 21 (a), (b) is a diagram illustrating expression of quantizing level on numeric line in the prior art and its code table;

FIG. 22 (a), (b) is a diagram illustrating expression of quantizing level on numeric line in the embodiment and its code table;

FIG. 31a-c is a model diagram illustrating transposing; and

DETAILED DESCRIPTION OF THE PREFERRED EMBODIMENTS

Figure 1:
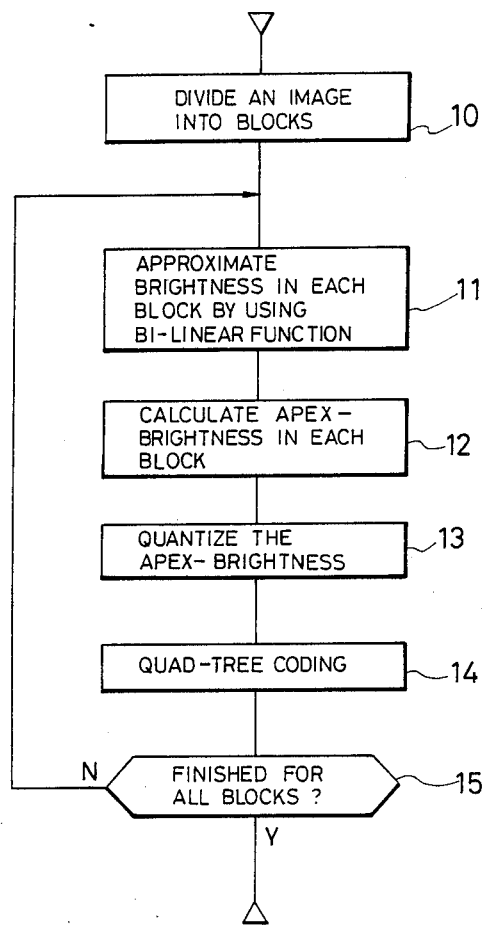
FIG. 1 is a flow chart of a method for image data coding as an embodiment of the invention.

FIG. 1 is a flow chart of coding procedure of image data illustrating an embodiment of the invention. In step 10, an image is divided into blocks being not equal in length corresponding to amount of brightness variation. This block dividing is performed by a method called block unifying.

Figure 3A:
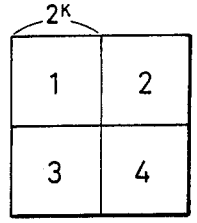
FIG. 3 (a), (b) is a diagram illustrating blok unifying.
Figure 3B:
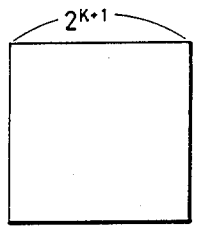

This processing is first started from picture element level, and if four picture elements contained in blocks of 2×2 size meet prescribed condition, they are unified in a block. In usual, four blocks of $2^k \times 2^k$ size as shown in FIG. 3(a) are unified into one block of $2^{k+1} \times 2^{k+1}$ as shown in FIG. 3(b).

Figure 2:
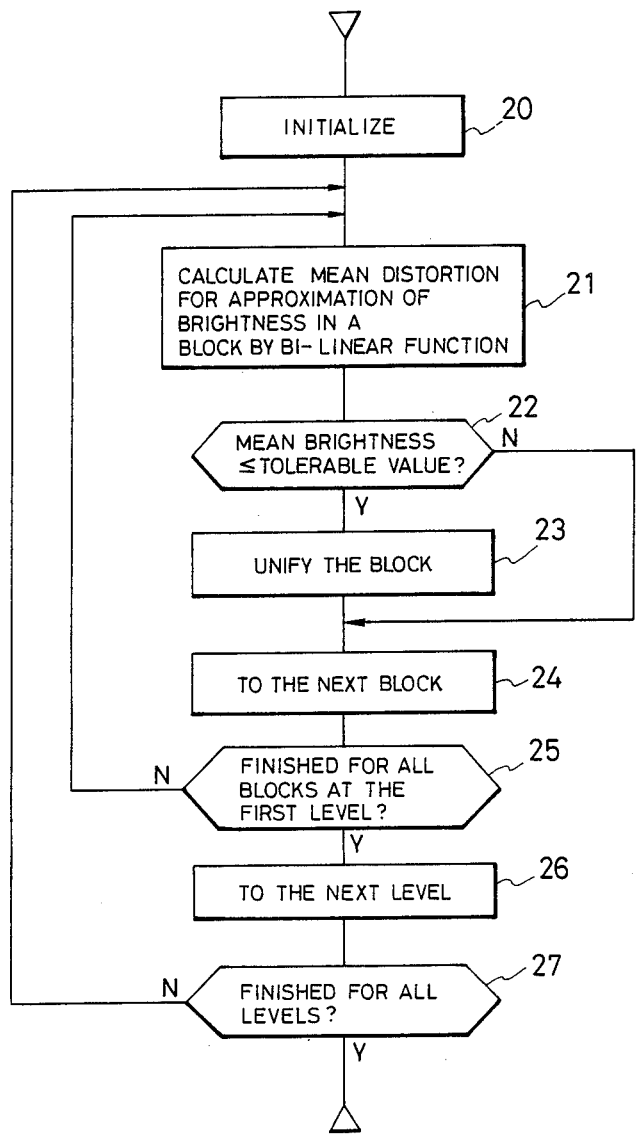
FIG. 2 is a flow chart illustrating details of image block dividing part in FIG. 1.

The block dividing will not be described in detail referring to a flow chart shown in FIG. 2. In initializing of step 20, the processing object is set to the picture element level. In step 21, mean distortion at approximation of brightness in a block by using bi-linear function $$fij = aij + bi + cj + d \tag{1}$$

is calculated by the following formula.

Wherein, (i, j) designates coordinates on the image, and fij designates brightness of (i, j). If the mean distortion is made Q, it follows that $$Q = F - aL_1 - bL_2 - cL_3 - dL_4 \tag{2}$$

wherein $$F = \frac{1}{(2^k+1)^2} \sum_{i=0}^{2^k} \sum_{j=0}^{2^k} f_{i_0+i, j_0+j}^2 \tag{3}$$

$$L_1 = \frac{1}{(2^k+1)^2} \sum_{i=0}^{2^k} \sum_{j=0}^{2^k} ij\, f_{i_0+i, j_0+j} \tag{4}$$

$$L_2 = \frac{1}{(2^k+1)^2} \sum_{i=0}^{2^k} \sum_{j=0}^{2^k} i f_{i_0+i, j_0+j} \tag{5}$$

$$L_3 = \frac{1}{(2^k+1)^2} \sum_{i=0}^{2^k} \sum_{j=0}^{2^k} j f_{i_0+i, j_0+j} \tag{6}$$

$$L_4 = \frac{1}{(2^k+1)^2} \sum_{i=0}^{2^k} \sum_{j=0}^{2^k} f_{i_0+i, j_0+j} \tag{7}$$

$$a = \frac{L_1 \epsilon^2 - L_2 \epsilon \gamma - L_3 \epsilon \gamma + L_4 \gamma^2}{(\alpha \epsilon - \gamma^2)^2} \tag{8}$$

$$b = \frac{-L_1 \epsilon \gamma + L_2 \epsilon \alpha - L_3 \gamma^2 + L_4 \alpha \gamma}{(\alpha \epsilon - \gamma^2)^2} \tag{9}$$

$$c = \frac{-L_1 \gamma \epsilon - L_2 \gamma^2 - L_3 \alpha \epsilon + L_4 \alpha \gamma}{(\alpha \epsilon - \gamma^2)^2} \tag{10}$$

$$d = \frac{L_1 \gamma^2 - L_2 \alpha \gamma - L_3 \alpha \gamma + L_4 \alpha^2}{(\alpha \epsilon - \gamma^2)^2} \tag{11}$$

$$\alpha = \frac{1}{6} \cdot 2^k (2^{k+1} + 1) \tag{12}$$

$$\gamma = \frac{1}{2} \cdot 2^k \tag{13}$$

$$\epsilon = 1 \tag{14}$$

Figure 4:
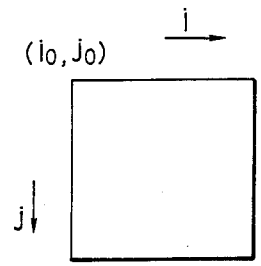
FIG. 4 is a diagram illustrating manner of taking coordinates on a block.

$(i_o, j_o)$ designate coordinates of the block origin (refer to FIG. 4) Formulae (3)-(7) are definition formulae of F and $L_1$-$L_4$. In the actual calculation, however, without calculating such picture element level, values F, $L_1$-$L_4$ of parent block can be estimated from values of F and $L_1$-$L_4$ of four child blocks efficiently using following recurrence formulae.

$$F = \tfrac{1}{4}\{F(1) + F(2) + F(3) + F(4)\} \tag{15}$$

$$L_1 = \tfrac{1}{4}\{L_1(1) + L_1(2) + L_1(3) + L_1(4) + \tag{16}$$

$$2^{k-1}L_2(3) + 2^{k-1}L_2(4) + 2^{k-1}L_3(2) + 2^{k-1}L_3(4) +$$

$$2^{k-1}2^{k-1}L_4(4)\}$$

$$L_2 = \tfrac{1}{4}\{L_2(1) + L_2(2) + L_2(3) + L_2(4) + \tag{17}$$

$$2^{k-1}L_4(2) + 2^{k-1}L_4(4)\}$$

$$L_3 = \tfrac{1}{4}\{L_3(1) + L_3(2) + L_3(3) + L_3(4) + \tag{18}$$

-continued $$2^{k-1}L_4(3) + 2^{k-1}L_4(4)\}$$

$$L_4 = \tfrac{1}{4}\{L_4(1) + L_4(2) + L_4(3) + L_4(4)\} \quad (19)$$

wherein, F(i), L(i) are values of F, L of child block i. Numbering of blocks is according to FIG. 3(a).

Step 21 of FIG. 2 has been described, and step 22 will now be described.

In step 22, discrimination is performed whether the mean tolerance Q calculated by formula (2) is less than the tolerable value or not. If the mean distortion Q is less than the tolerable value, process is advanced to block unifying in step 23. On the contrary, if the mean distortion Q is more than the tolerable value, the block unifying is not performed. Among four child blocks, if one or more blocks are not unified, also the unifying is not performed.

The tolerable value of the mean distortion is determined in relation between the compression ratio and the picture quality. It is determined depending on various cases, for example, when improvement of the compression ratio is intended even sacrificing the picture quality, or when importance is attached to the picture quality and the compression ratio need not be so high.

In step 23, flag is established to indicate that the block is unified, and values of F and $L_1$–$L_4$ are preserved for unifying at next level.

In step 24, processing of next block is advanced. In step 25, discrimination is performed regarding whether processing of all blocks at present study level is finished or not. If the processing of all blocks is finished, process is advanced to next level in step 26, and size of the block is enlarged to twice. In step 27, discrimination is performed regarding whether processing for all levels is finished or not. If the processing is finished, it follows that processing of the block dividing is finished.

Description of coding will be continued referring to the flow chart of FIG. 1 again.

In step 11, according to formulae (8)–(11), coefficients a–d of bi-linear function of formula (1) in each block are estimated. The coefficients a–d were already calculated as intermediate data in the block dividing processing, but will now be calculated again so as to prevent accumulation of error at using the recurrence formulae.

In step 12, coordinates $(i_o, j_o)$, $(i_o+2^k, j_o)$, $(i_o, j_o+2^k)$, $(i_o+2^k, j_o+2^k)$ of four apexes in each block are substituted in the bi-linear function estimated in step 11, and brightness of each apex is estimated. This processing specifies the bi-linear function not by the coefficients a–d but by brightness of the four apexes of the block, and provides preparation for coding at brightness level as hereinafter described.

Figure 5A:
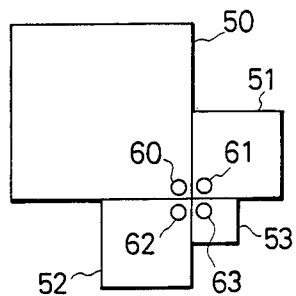
FIG. 5 (a), (b) is a diagram illustrating calculation system of block apex brightness.
Figure 5B:
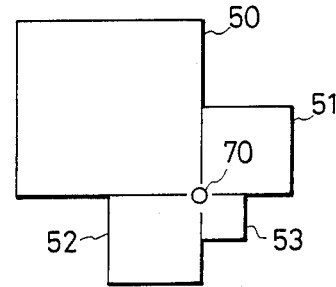

As shown in FIG. 5(a), four apex-brightness values are formed around the grid point at the block dividing. In FIG. 5(a), numerals 60–63 designate apex-brightness values formed by the bi-linear approximation of blocks 50–53 respectively. In step 12, these brightness values are weighted with size of the blocks, and unified in one brightness (refer to 70 in FIG. 5(b)) on the grid point.

The above-mentioned unifying is performed, for example, according to following formula.

$$f = \frac{4^{k_1}f_1 + 4^{k_2}f_2 + 4^{k_3}f_3 + 4^{k_4}f_4}{4^{k_1} + 4^{k_2} + 4^{k_3} + 4^{k_4}} \quad (20)$$

wherein, numerals $f_1$–$f_4$ designate the four apex-brightness values, and numerals $4^{k_1}$–$4^{k_4}$ designate area of the corresponding blocks. The weighting is introduced from condition to minimize distortion produced at unifying the brightness.

In step 13, the apex-brightness unified by step 12 (hereinafter simply referred to as "apex-brightness") is quantized. For example, a uniform quantizer may be used as quantizer. In this case, the coding bit number is made variable depending on size of the block having relation to the apex-brightness.

For example, when b is made the assignment bit number, following condition is specified.

$$b = k + c \quad (21)$$

wherein, k is exponent part when area of maximum block having relation to the apex is made $4^k$, and c is control parameter.

According to formula (21), apex-brightness relating to a large block is assigned with much coding bit number, and apex-brightness relating to a small block is assigned with little bit number.

Figure 6A:
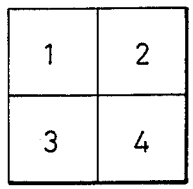
FIG. 6 (a), (b) is a diagram illustrating principle of Quad-Tree expression.
Figure 6B:
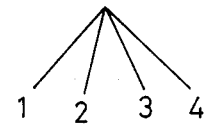

In step 14, the apex-brightness is coded into quad-tree structure. According to the quad-tree, sub-blocks divided into four (refer to FIG. 6(a)) can be represented by four leaves (refer to FIG. 6(b)) respectively. This is suitable for expression of the block dividing structure.

However, since the coding data in the embodiment has one-to-one correspondence not to the block but to the apex, the quad-tree coding of the data requires measure as hereinafter described.

Figure 7A:
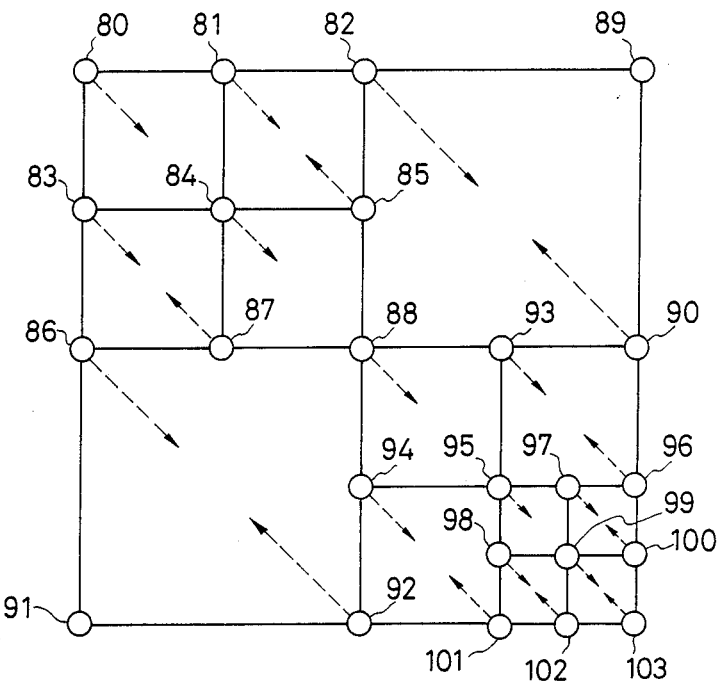
FIG. 7 (a), (b) is a diagram illustrating Quad-Tree coding.

The measure will be described referring to FIG. 7. As shown by FIG. 7(a), first, apex (shown by O) has correspondence (shown by broken line) to a block. As clearly seen from the figure, some blocks have correspondence to one apex, but other blocks have correspondence to two apexes. That is, when lower right-hand apex of a block is T-like point, the block has correspondence to two apexes. Otherwise, a block has correspondence to one apex.

Figure 7B:
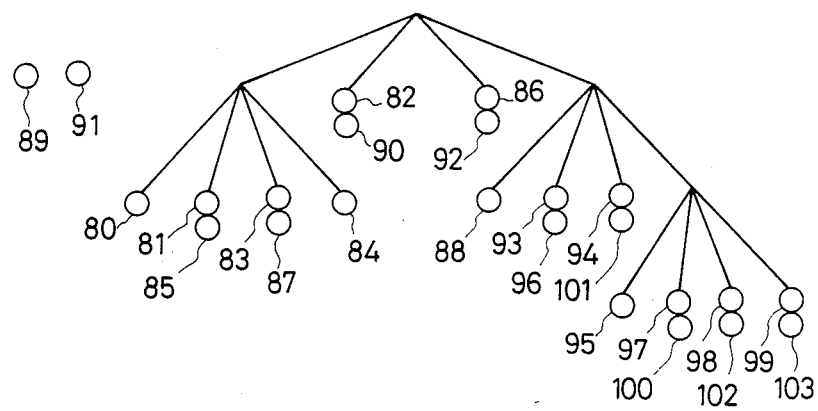

The block dividing structure is expressed in the quad-tree as shown in FIG. 7(b), and corresponding apex-brightness is assigned to leaf portion of the quad-tree. When a leaf represents a block having correspondence to one apex, brightness data becomes one. On the contrary, when a leaf represents a block having correspondence to two apexes, brightness data becomes two.

Regarding an upper right-hand apex (89) and a lower left-hand apex (91), above-mentioned correspondence does not apply and therefore both are not included in the quad-tree.

The quad-tree of FIG. 7(b) is assigned with, for example.

(1) branch node: one bit
(2) one-data node: 2 bits
(3) two-data node: 2 bits as node identification bits, and takes description in depth first structure, thereby it can be stored in one-dimensional arrangement. In this case, the upper right-hand apex and the lower left-hand apex may be stored at the top or the last end of the one-dimensional arrangement.

In step 15, discrimination is performed regarding whether coding for all blocks is finished or not. If it is finished, the coding of the image is finished.

Figure 8:
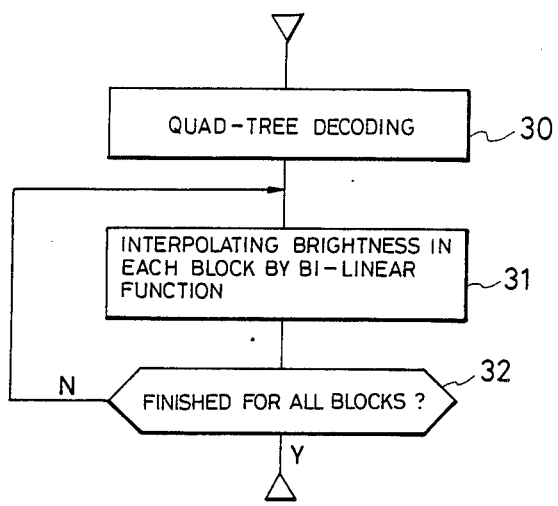
FIG. 8 is a flow chart of decoding.

FIG. 8 shows a flow chart of decoding. In step 30, the quad-tree stored in the one-dimensional arrangement is decoded and coordinates of apex are specified, and brightness of the apex is located on the image buffer. The brightness data regarding all apexes are located on the image buffer, and then in step 31, interporating by bi-linear function is performed in each block, and brightness in the block is formed.

This processing is performed according to procedure as hereinafter described. First, coefficients of the bi-linear function are estimated by following formulae.

$$a = \frac{1}{2^k 2^k}(f_1 + f_3 - f_2 - f_4) \quad (22)$$

$$b = \frac{1}{2^k}(f_2 - f_1 - 2^k j_0 a) \quad (23)$$

$$c = \frac{1}{2^k}(f_3 - f_1 - 2^k i_0 a) \quad (24)$$

$$d = f_1 - a i_0 j_0 - b i_0 - c j_0 \quad (25)$$

Subsequently, the brightness data in the block are formed according to formula (1).

In step 32, discrimination is performed regarding whether processing for all blocks is finished or not. If it is finished, the encoding of the image is finished.

FIG. 9 shows a device constitution diagram for executing processing of the embodiment. In FIG. 9, numeral 40 designates an image buffer where input image from a scanner is stored. The buffer 40 need not be capable of storing the whole image. In this case, the image is divided into partial images, and coding is performed in partial image unit.

An encoder 41 performs coding of input image on the image buffer 40 using a working buffer 42, and outputs coding data to a code buffer 43. The coding data passes through a modem 44, a communication path and a modem 49, and is stored in a code buffer 48.

A decoder 46 performs decoding using a working buffer 47, and outputs decoding image to an image buffer 45. The decoding image is displayed on a display or the like.

Although the communication system is exemplified in the embodiment, this can be applied also to a storage system, of course. In the case of the storage system, ports corresponding to the communication path are replaced by storage means such as a magnetic disc, optical disc or the like.

According to the embodiment as above described, data compression coding system can be realilzed where distortion at encoding/decoding processing is quantitatively evaluated thereby proper block dividing can be performed, and not only local redundancy of the image but also global redundancy can be suppressed and compressed.

Calculation of the distortion can be performed not using the picture element level but using recurrence formula, thereby the coding is performed at high speed.

Although application of the invention to coding of image data is described in the embodiment, the invention is not limited to this but can, of course, be widely applied to coding of numeric data distributed in two-dimensional arrangement.

Second and third embodiments of the invention will be described.

Figure 10:
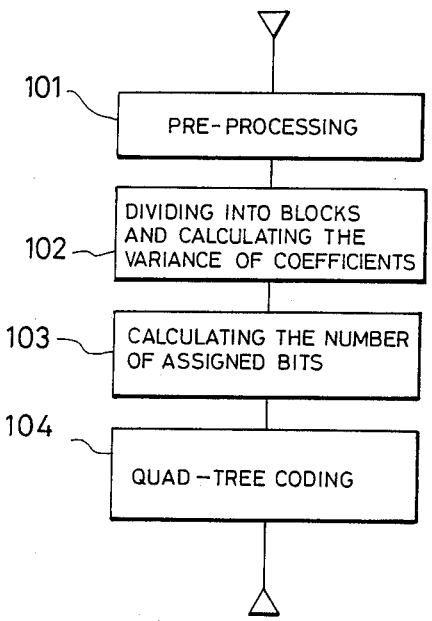
FIG. 10 is a flow chart of coding processing as a whole in a second embodiment of the invention.

FIG. 10 is a flow chart illustrating coding procedure in the second embodiment. In processing block 101, pre-processing to an input image is performed. This intends to reduce the assigned bit number in quantization at subsequent step, and is performed in following procedure for example. An input image of N x N size is divided into sub-images of M x M size, and mean value is calculated in each sub-image and made $E_s(f)$. Wherein, s is suffix indicating sub-image. To brightness $f_{ij}$ of picture element (i, j) belonging to the sub-image, difference brightness is estimated by following formula.

$$f_{ij}' = f_{ij} - E_s(f) \quad (26)$$

Calculation of formula (26) is performed for the whole image using mean brightness of sub-image to which each picture element belongs, and the pre-processing is finished.

Figure 11:
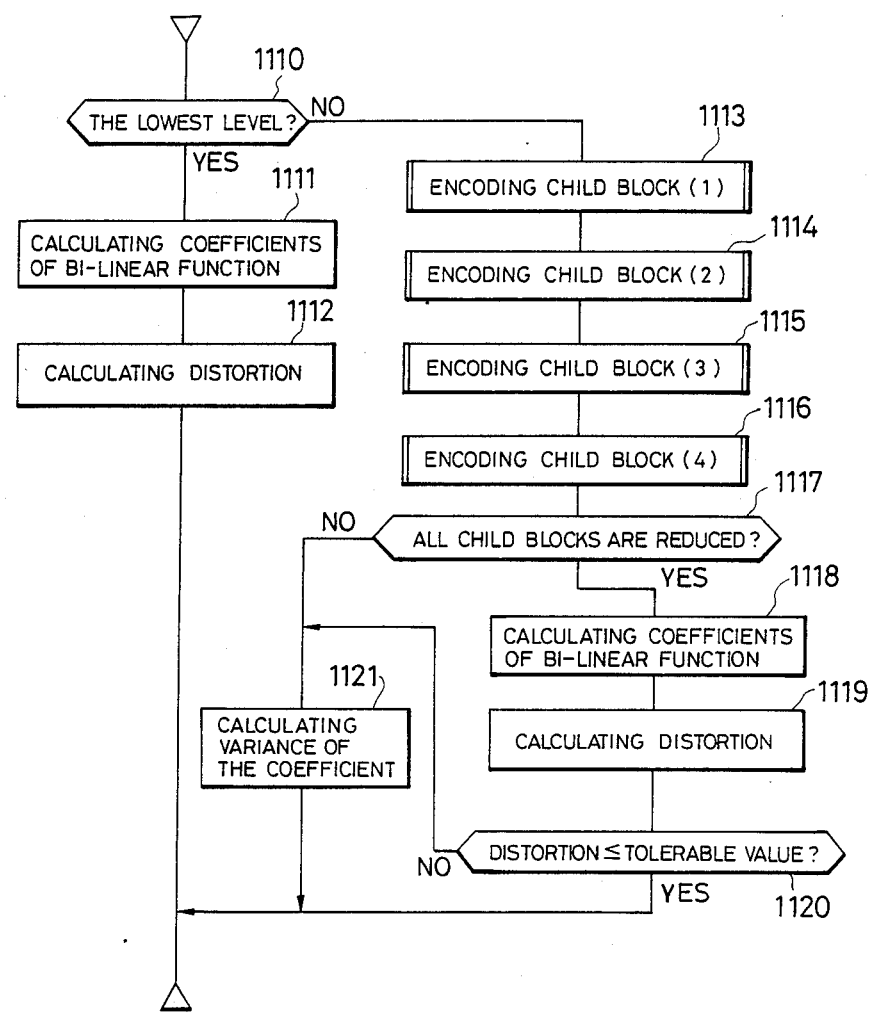
FIG. 11 is a detailed flow chart of a processing block 102 in FIG. 10.
Figures 12, 13, 14:
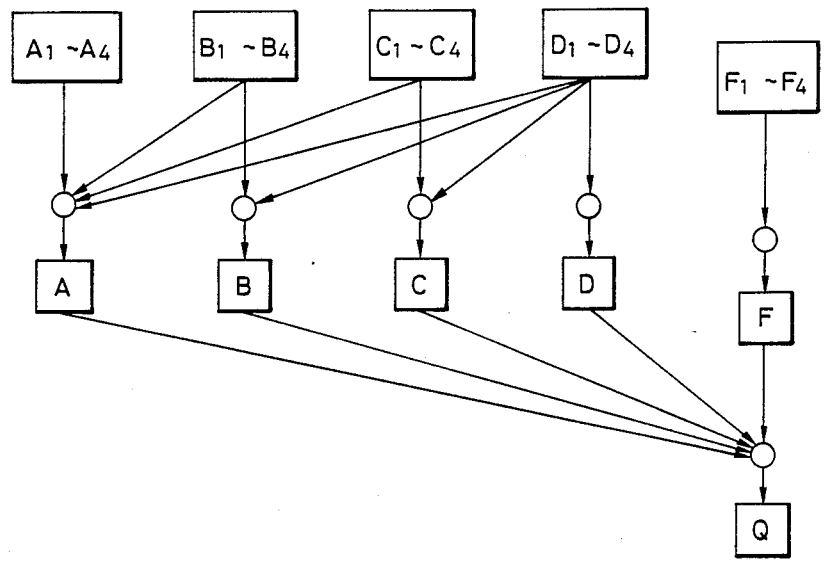
FIG. 12 is a data flow diagram of coefficient calculation by recurrence formula.
FIG. 13 is a constitution diagram of bit assignment table.
FIG. 14 is a diagram illustrating sequence of blocks.

In processing block 102 of FIG. 10, the input image is divided into blocks, and variance of coefficients at approximation of brightness in the block by bi-linear function is estimated. The block dividing may be performed at sub-image unit or for the whole input image, but the variance shall be calculated for the whole input image. Detailed procedure of the processing block 102 will be described referring to a flow chart of FIG. 11. The flow chart of FIG. 11 includes recursive procedure, and processing blocks 1113–1116 call itself. First, the whole input image is set as a block (size and coordinates of the block being set). In processing block 1110, discrimination is performed regarding whether the set block is the lowest level or not. If it is the lowest level, process is advanced to processing block 1111; if not, process is advanced to processing block 1113. The lowest level means a block of 2×2 size, and corresponds to node of the lowest level at expression by the quad-tree. In the processing block 1111, coefficients of bi-linear function for the block of 2×2 size are calculated by following formulae.

$$A = \tfrac{1}{4}(f_1' + f_4' - f_2' - f_3') \quad (27)$$

$$B = \tfrac{1}{4}(f_2' + f_4' - f_1' - f_3') \quad (28)$$

$$C = \tfrac{1}{4}(f_3' + f_4' - f_1' - f_2') \quad (29)$$

$$D = \tfrac{1}{4}(f_1' + f_2' + f_3' + f_4') \quad (30)$$

wherein, A–D are coefficients of the bi-linear function, and $f_1'$–$f_4'$ are difference brightness of four picture elements (brightness after pre-processing). For simplification, difference brightness shall be hereinafter called brightness. Numbering of suffix of f' is performed for the four picture elements in sequence shown in FIG. 14. Brightness variation of the block of 2×2 size can be expressed always by bi-linear function without distortion. In the processing block 1112 of FIG. 11, however, calculation of following formula (31) is performed as preparation for calculating distortion in a block of size of 4×4 or more afterwards.

$$F = (f_1')^2 + (f_2')^2 + (f_3')^2 + (f_4')^2 \quad (31)$$

wherein, F is intermediate variable for calculating distortion in rearward stage. If discrimination in the processing block 1110 is that the set block is not the lowest level, recursive calling is performed in the processing blocks 1113-1116. That is, the study block is divided into 4 as shown in FIG. 14, and then using size and coordinates of respective child blocks as argument, procedure itself in FIG. 11 is called again. In processing block 1117, discrimination is performed regarding whether four child blocks are reduced or not. "Reduced" means that the block is not divided further finely. That is, when approximation by bi-linear function is performed as single block, distortion is tolerable value or less. When all four child blocks are reduced, they can be unified into a larger block. Calculation therefor and discrimination are performed in processing blocks 1118-1120. In the processing block 1118, coefficients of bi-linear function in the study block are calculated. Since all four child blocks are reduced and coefficients of bi-linear function in these blocks have been already calculated in the processing blocks 1113-1116, the coefficients can be calculated not by calculating the picture element level but by using following recurrence formulae (refer to data flow in FIG. 12).

$$A = \frac{1}{\alpha_k} \left\{ \alpha_{k-1}(A_1 + A_2 + A_3 + A_4) + \right. \tag{32}$$

$$\frac{2^k}{4} \sqrt{\alpha_{k-1}\epsilon_{k-1}}(B_3 + B_4 - B_1 - B_2) +$$

$$\frac{2^k}{4} \alpha_{k-1}\epsilon_{k-1}(C_2 + C_4 - C_1 - C_3) +$$

$$\left. \frac{4^k}{16} \epsilon_{k-1}(D_1 + D_4 - D_2 - D_3) \right\}$$

$$B = \frac{1}{\sqrt{\alpha_k\epsilon_k}} \left\{ \sqrt{\alpha_{k-1}\epsilon_{k-1}}(B_1 + B_2 + B_3 + B_4) + \right. \tag{33}$$

$$\left. \frac{2^k}{4} \epsilon_{k-1}(D_2 + D_4 - D_1 - D_3) \right\}$$

$$C = \frac{1}{\sqrt{\alpha_k\epsilon_k}} \left\{ \sqrt{\alpha_{k-1}\epsilon_{k-1}}(C_1 + C_2 + C_3 + C_4) + \right. \tag{34}$$

$$\left. \frac{2^k}{4} \epsilon_{k-1}(D_3 + D_4 - D_1 - D_2) \right\}$$

$$D = \frac{\epsilon_{k-1}}{\epsilon_k}(D_1 + D_2 + D_3 + D_4) \tag{35}$$

wherein, $A_1-A_4$, $B_1-B_4$, $C_1-C_4$, $D_1-D_4$ are coefficients of bi-linear function of the four child blocks (Suffix 1-4 show the child blocks), and $\alpha k, Ek$ are parameters determined by following formulae.

$$\alpha_k = \frac{1}{12} \cdot 2^k(2^k - 1)(2^k - 1) \tag{36}$$

$$\epsilon_k = 2^k \tag{37}$$

wherein, k is exponent part when size of the study block is represented by $2^k \times 2^k$ Formulae (32)-(35) are introduced from idea as hereinafter described. Regarding the study block, the picture element at the upper left-hand corner is taken as the origin, and when rightward direction is taken as i-axis and downward direction is taken as j-axis, bi-linear function $\widetilde{f}_{ij}$ is defined as follows.

$$\widetilde{f}_{ij} = \frac{A}{\alpha_k}(i - (2^k - 1)/2)(j - (2^k - 1)/2) + \tag{38}$$

$$\frac{B}{\sqrt{\alpha_k\epsilon_k}}(i - (2^k - 1)/2) + \frac{C}{\sqrt{\alpha_k\epsilon_k}}(j - (2^k - 1)/2) + D/\epsilon_k$$

In formula (38), brightness in the block is approximated so that the distortion Q becomes minimum, i.e., following formula (39) becomes minimum, and values A-D are determined.

$$Q = \sum_{i=0}^{2^k-1} \sum_{j=0}^{2^k-1} (\widetilde{f}_{ij} - f_{ij})^2 \tag{39}$$

Similar formulae can be constituted also regarding the four child blocks, and from relation between these formulae and formulae (38), (39), the formulae (32)-(35) can be introduced. In the formula (38), coefficients A-D are multiplied by parameters of $\alpha k$, $\epsilon k$. Because it is intended that influence of error of the coefficients A-D to the distortion of formula (39) is equalized. In the processing block 1119, the distortion Q is calculated by following formula.

$$Q = F - A^2 - B^2 - C^2 - D^2 \tag{40}$$

wherein F is calculated from $F_1-F_4$ of the four child blocks by following formula.

$$F = F_1 + F_2 + F_3 + F_4 \tag{41}$$

In the processing block 1120, discrimination is performed regarding whether the distortion calculated by formula (40) is the tolerable value or less. If the distortion is the tolerable value or less, it follows that the four child blocks are unified, and procedure in the flow chart of FIG. 11 is finished (In actual state, in a block other than that of the highest level, process is returned to the parent block performing recursive calling.). When discrimination in the processing block 1117 is that any of the child blocks is not reduced, or when discrimination in the processing block 1120 is that distortion of the study block is over the tolerable value, in the processing block 1121, update of variance of the coefficient is calculated regarding the reduced child block. If variance of the coefficients A-D of the block of $2^k \times 2^k$ size is expressed by $\sigma^2(A, k) - \sigma^2(D, k)$, it follows that $$\sigma^2(A, k) = \frac{1}{n_k} \sum_{l \in L_k} A_l \tag{42}$$

$$\sigma^2(B, k) = \frac{1}{n_k} \sum_{l \in L_k} B_l \tag{43}$$

$$\sigma^2(C, k) = \frac{1}{n_k} \sum_{l \in L_k} C_l \tag{44}$$

$$\sigma^2(D, k) = \frac{1}{n_k} \sum_{l \in L_k} D_l \tag{45}$$

wherein, l is suffix representing a block, and $L_k$ is set of blocks of $2^k \times 2^k$ size. $n_k$ is the total number of blocks of $2^k \times 2^k$ size.

In actual state, $\sigma^2(A, k) \sim \sigma^2(D, k)$ can be determined when the block dividing is finished. In the processing block 1121, intermediate value is calculated for a block where dividing is settled before that time.

Processing shown in the flow chart of FIG. 11, as above described, starts from the block of 2×2 size using recursive procedure, and unifies blocks in sequence thereby performs the block dividing. The block dividing structure may be coded into the quad-tree data in this time. In the embodiment, however, coding is performed together at rearward stage, and only variance of the coefficient of bi-linear function is outputted in this time.

Returning to FIG. 10 again, calculation of the number of assigned bits of the processing bits will be described. Based on $\sigma^2(A, k) - \sigma^2(D, k)$ determined in the processing block 102, quantizing bit number of coefficient of a block of $2^k \times 2^k$ size is calculated by following formula.

$$b(X,k) = \log_2 \sigma(X,k) + \log_2 \left( 2p \sqrt{\frac{\Sigma n_k}{QR + (0.25N)^2}} \right) \quad (46)$$

Wherein, b(X, k) : quantizing bit number of coefficient X (any of A–D) of a block of $2^k \times 2^k$ size, $\sigma(X, k)$ : standard deviation thereof, $n_k$ : total number of blocks of $2^k \times 2^k$ size, QR : generated distortion, N : length of one side of an image, p : external parameter. The generated distortion QR is defined by following formula (47), and has been calculated in the processing block 102.

$$QR = \sum_{k>2} \sum_{l \in L_k} Q_l \quad (47)$$

Wherein, Ql is distortion generated in the block l after approximation by bi-linear function. Bit assigning formula (46) is introduced from idea as hereinafter described. That is, the bit assigning amount is determined so that total coding amount becomes minimum under condition that the quantizing distortion is $1/p^2$ of the generated distortion. Wherein p is external parameter providing relation between the quantizing distortion and the generated distortion, and value of about 4 may be used as p in usual. Term $(0.25N)^2$ in denominator of the second term of formula (46) is added for convenience so as to prevent generation of dividing by zero. As a result of calculation of bit assigning as above described, a bit assigning table shown in FIG. 13 can be obtained. Since it is assumed in the example of FIG. 13 that coding is performed at each sub-image of 16×16 size, maximum value of k becomes $\log_2 16 = 4$.

Figure 15:
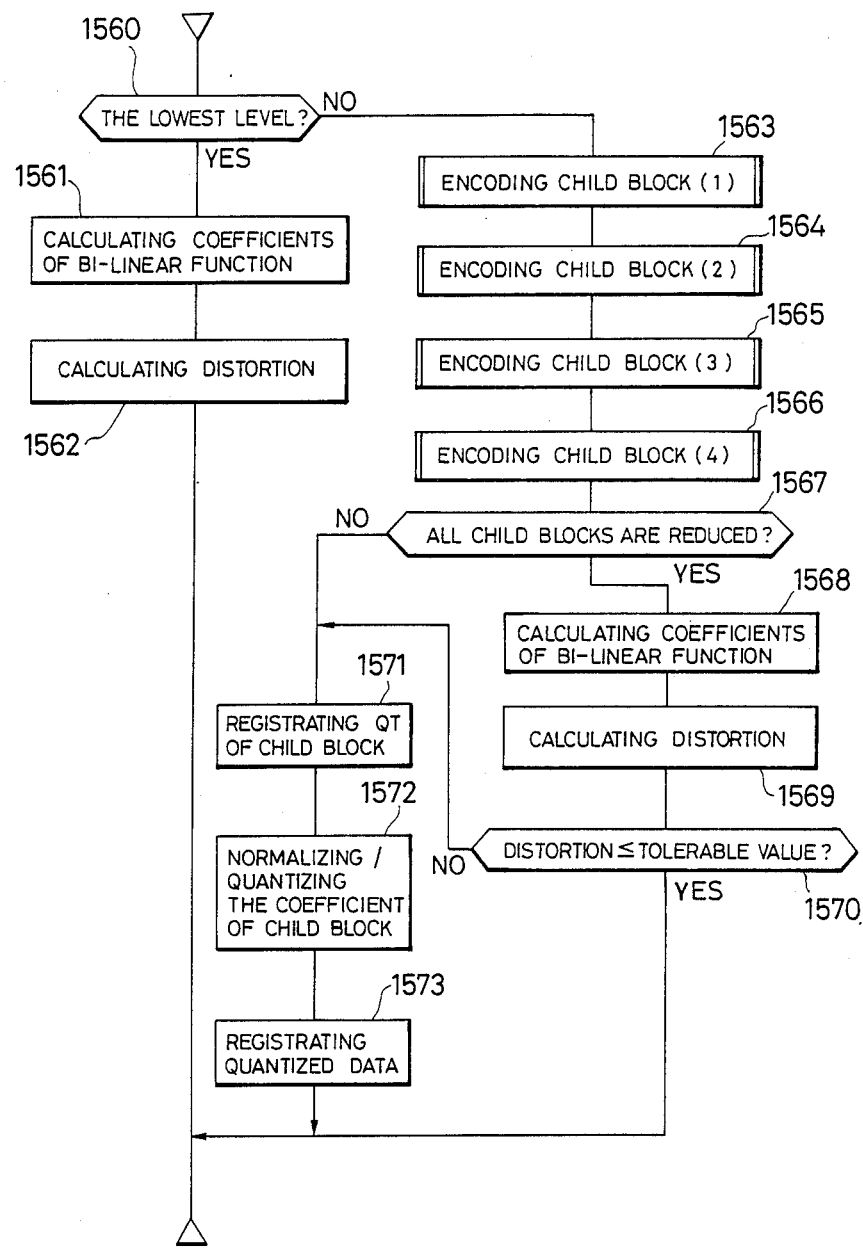
FIG. 15 is a detailed flow chart of a processing block 104 in FIG. 10.
Figure 16A:
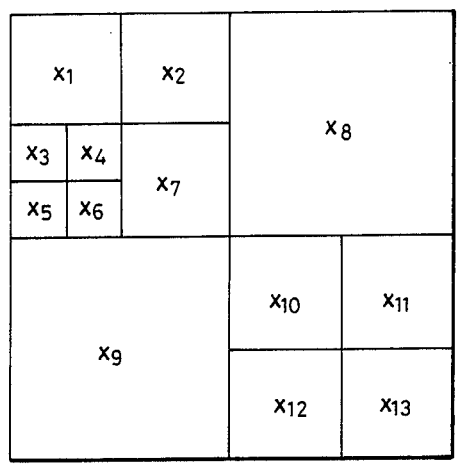
FIG. 16 (a) is a block dividing diagram, (b) is a diagram illustrating Quad-Tree corresponding to the dividing diagram (a), and (c) is a diagram illustrating Quad-Tree coding data series of diagram (a)
Figure 16B:
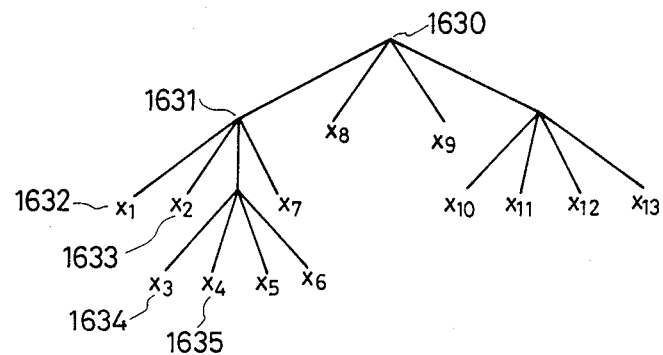
Figure 16C:
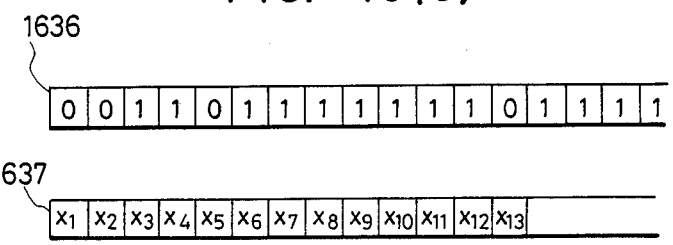

In the processing block 104 of FIG. 10, coefficient is quantized, and further the quad-tree coding is performed. Details of the processing block 104 will be described referring to a flow chart of FIG. 15. Considerable portion is common to processing of FIG. 15 and processing of FIG. 11. In processing blocks 1560–1570 of FIG. 15, the same processing as that of the processing blocks 1110–1120 of FIG. 11 is performed. FIG. 15 is different from FIG. 11 in coding of processing blocks 1571–1573. First, in the processing block 1571, the block dividing structure is coded into quad-tree data (QT). This state is shown in FIG. 16. The block dividing structure of FIG. 16(a) is expressed by the quad-tree of FIG. 16(b). Node of the quad-tree corresponds to the block of FIG. 14 in sequence from the left to the right. The quad-tree is coded in depth first structure into bit series 1636 shown in FIG. 16(c). That is, starting from root node 1630 of FIG. 16(b), in sequence of node 1631, 1632, 1633, 1634, 1635 ..., branch node (such as 1630, 1631 or the like) is coded to 0, and data node (corresponding to block, such as 1632, 1633, 1634, 1635 or the like) is coded to 1. In the processing block 1571, every time the block is settled, additional update of the bit series is performed. In the processing block 1572, coefficient of bi-linear function of the settled block (block which is not further unified) is normalized and quantized. Normalizing is performed for coefficient X (any of A–D) of a block of $2^k \times 2^k$ size by following formula.

$$X_l^N = X_l / \sigma(X,k) \quad (48)$$

Wherein, $X_l^N$ is value of coefficient X of block l after normalizing. Quantizing may be performed using, for example, MAX quantizer to normal distribution (Arimoto: Digital Processing of Signal/Image, pp. 86–89, Sangyo Tosho Shuppansha (1980)). Normalized value of each coefficient is quantized by the number of assigned bits estimated in the processing block 103 of FIG. 10. Quantized data is coded as data series corresponding to the quad-tree data (QT) in the processing block 1573. This state is shown in data series 1637 of FIG. 16(c). However, in FIG. 16(c), quantized data of A–D is together expressed by x simply, and correspondence only to the QT data series 1636 can be seen.

Figure 17:
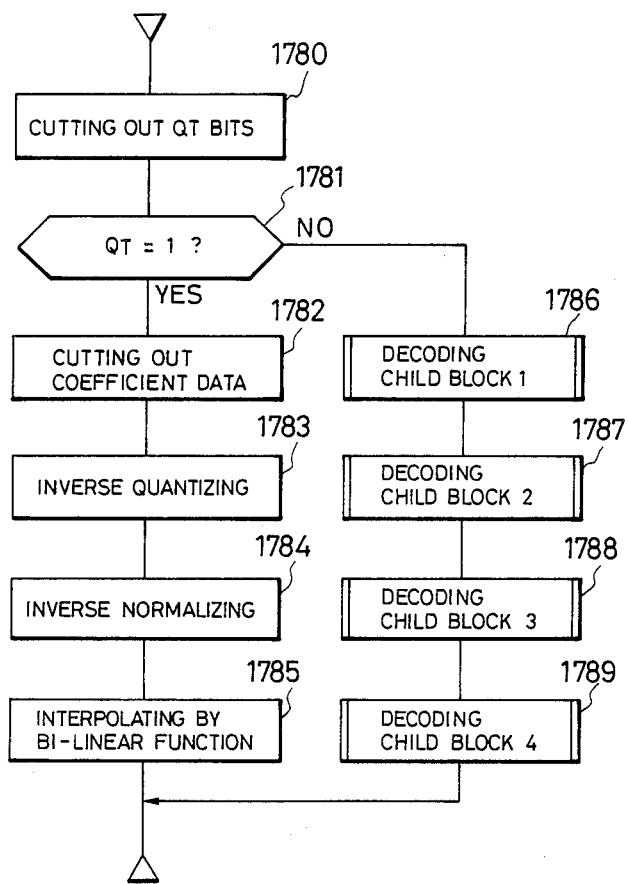
FIG. 17 is a flow chart of decoding.

Coding in FIG. 10 has been described, and an embodiment of decoding will now be described referring to FIG. 17. A flow chart of FIG. 17 also has recursive constitution in similar manner to FIG. 11, FIG. 15. In processing block 1780, one bit is cut out from QT among the coding data. In processing block 1781, discrimination is performed regarding whether QT is 1 (data node) or 0 (branch node). If it is 1, code address of brightness in the block is processed. First, in processing block 1782, corresponding coefficient data is cut out from the coefficient data series, and inverse quantizing and inverse normalizing are performed in processing blocks 1783, 1784 respectively. In processing block 1785, restored coefficient data A–D are substituted in formula (38), and then brightness of all picture elements in the block is decoded using the bi-linear function. As a result of decision in the processing block 1781, if the bit value is 0 (branch node), recursive processing is performed in processing blocks 1786–1789. The processing blocks 1786–1789 decode four child blocks corresponding to four child nodes of the branch node.

Figure 18A:
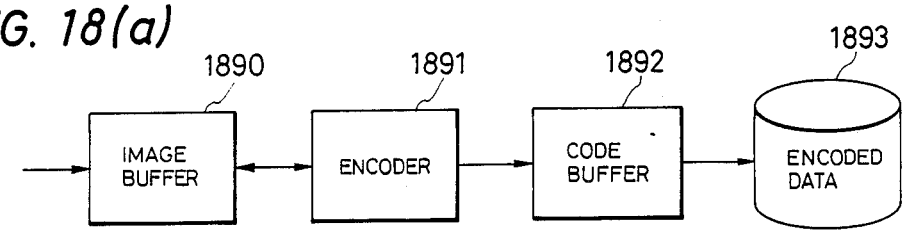
FIG. 18 (a), (b) is a constitution diagram of an encoder and a decoder.
Figure 18B:
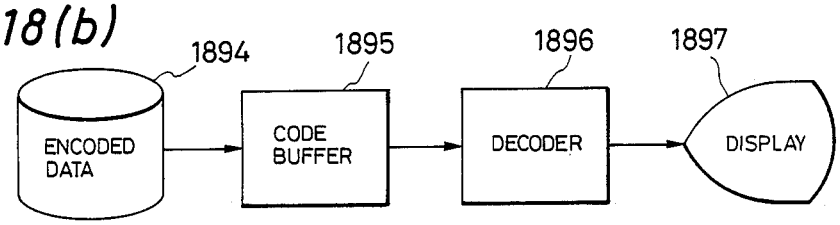

FIG. 18 shows a device constitution diagram of the embodiment. FIG. 18(a) shows an encoding device comprising an image buffer 1890, an encoder 1891, a code buffer 1892, and a memory 1893. Input image is loaded in sub-image unit to the image buffer 1890, and converted by the encoder 1891 into encoded data (data series 1636, 1637 in FIG. 16(c)). The encoded data is once stored in the code buffer 1892, and then stored in the code buffer 1892, and then stored in the memory 1893. FIG. 18(b) is a constitution diagram of a decoding device comprising a memory 1894, a code buffer 1895, a decoder 1896, and a display 1897. Code data is loaded in sub-image unit to the code buffer 1895 and decoded by the decoder 1896, and then displayed on the display 1897. Although the device constitution has been described in storage of the image data as an example, if a transmission device is installed in place of the memories 1893, 1894, the device constitution becomes that for image data transmission. The encoder and the decoder may be realized by an exclusive hardware, or otherwise may be constituted by a general-purpose processor with a working buffer. In the case of the latter, procedure given in FIG. 10, FIG. 11, FIG. 15 and FIG. 17 is programmed and used. Although the constitution example has been described regarding encoding and decoding in sub-image unit so as to decrease the buffer capacity, the input image in batch processing can be encoded and decoded.

According to the embodiment, since recurrence formula can be utilized in coefficient calculation of bi-linear function and distortion calculation during encoding, calculation of the picture element level by one time will do and the encoding can be performed at high speed.

Figure 19A:
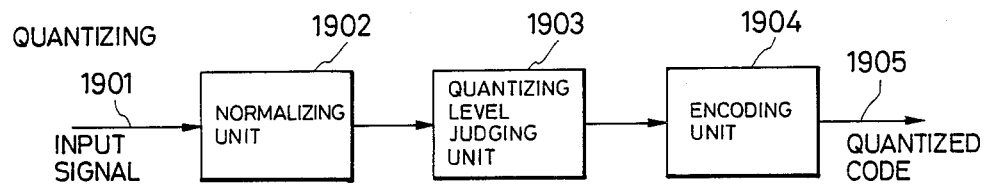
FIG. 19 (a), (b) is a block constitution diagram of a quantizer and an inverse quantizer in a third embodiment of the invention.

The third embodiment of the invention will be described referring to FIGS. 19 22. A quantizer as shown in FIG. 19(a) comprises a normalizing unit 1902, a quantizing level judging unit 1903, and an encoding unit 1904.

In the normalizing unit 1902, input signal 1901 is normalized to enable quantizing using the common quantizing table. When the input signal value is made f, the normalizing value $f_N$ can be calculated by following formula.

$$f_N = \frac{f}{\sigma}$$

$$\sigma^2 = \int_{-\infty}^{\infty} p(f) \cdot f^2 \, df$$

wherein, p(f) is probability density function of f, and $\sigma$ is standard deviation and previously calculated. Mean value of f is assumed 0.

In the quantizing level judging unit 1903, the quantizing level of the normalizing signal $f_N$ is judged. In the encoding unit 1904, the quantizing level is encoded. Referring to FIG. 20, FIG. 21, disadvantages in conventional system regarding the setting method of quantizing level and level code will be clarified, and then the remedy according to the embodiment will be described.

Figure 20A:
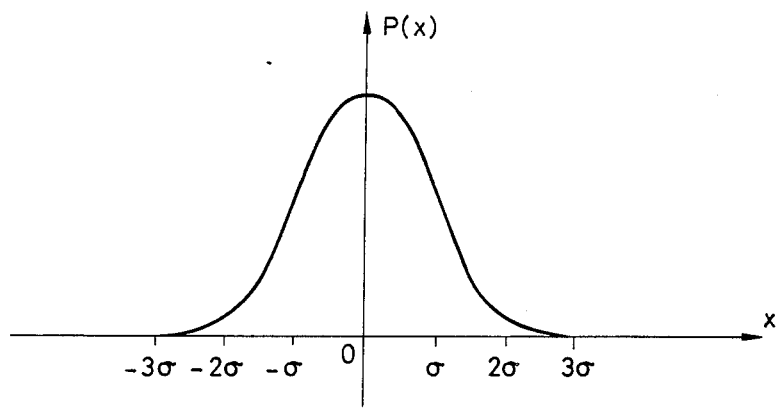
FIG. 20 (a), (b) is a graph of probability density function of Gaussian distribution and its modification.

FIG. 20(a) shows form of Gaussian distribution, and in conventional system, the quantizing level and the threshold value for the level judging are calculated so that the mean quantizing error with respect to the Gaussian distribution becomes minimum. The quantizing level $L_i$, the threshold value $T_i$ obtained as a result of the calculation in the case of 3 bit quantizer as an example shall be shown on numeric line 2112 in FIG. 21(a). Since the Gaussian distribution is symmetric with respect to the origin, only 4 levels at the positive side are shown here. On the numeric line 2111, the normalized standard deviation value corresponding to the numeric line 2112 is shown. Judging of the quantizing level is performed using the threshold value $T_i$ as follows.

If $T_i \leq f_N < T_{i+1}$    $f_Q = L_i$ $(i = 1,2,3)$

Figure 20B:
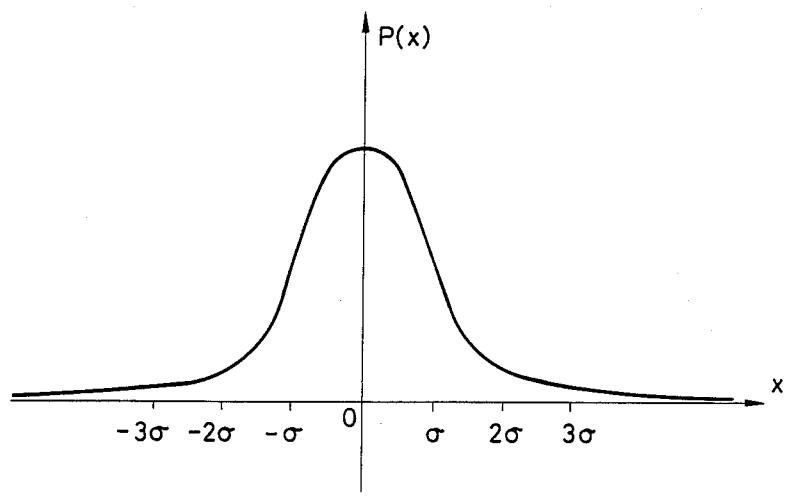

If $T_4 \leq f_N$    $f_Q = L_4$ wherein, $f_Q$ is the quantizing level of $f_N$. In this case, fixed length 3-bit as shown in FIG. 21(b) is used in the level code. In FIG. 21(b), the top bit s is sign bit showing positive or negative polarity. As above described, in conventional system, when distribution of input signal is the Gaussian distribution, quantizing is performed so that the mean error becomes minimum. However, when generation frequency of abnormal value increases, for example, when distribution of the input signal is deformed as shown in FIG. 20(b), the quantizing error increases. The reason is in that although generation frequency of signal to produce condition that $$f_N \geq T_4$$

increases, the signal value is all quantized in level L4.

This embodiment solves this problem as hereinafter described. In the example of FIG. 21, uniform distribution is assumed to some range of $f_N T_4$, and three threshold values $T_5$, $T_6$, $T_7$ and three quantizing levels $L_5$, $L_6$, $L_7$ are newly set. That is, the level values $L_5$, $L_6$, $L_7$ are specified so that interval between the quantizing levels are made regular interval $$\Delta L = L_4 - L_3$$

, and the threshold value $T_i$ is specified in that $$T_i = \tfrac{1}{2}(L_{i-1} + L_i) \quad (i = 5, 6, 7)$$

When such quantizing level and threshold value are set, even if generation frequency of signal to produce condition $f_N \geq T_4$ increases, four quantizing levels can be used for range of $f_N \geq T_4$ and therefore increase of the quantizing error is prevented. Encoding is performed in variable length encoding in two steps as shown in FIG. 22(b). Encoding in three bits is performed to quantizing level $L_3$ in similar manner to the prior art, and encoding in five bits is performed in $L_4$-$L_7$. In FIG. 22(b), the code S11 may be deemed as changing signal from 3-bit code to 5-bit code, and used for the changing discrimination during decoding.

General description of the above system is summarized as follows. The k-bit quantizer in the prior art has $2^k$ quantizing levels (considering both positive and negative directions), and $(2^k - 2)$ quantizing levels are newly set in above-mentioned procedure, thereby total $(2^k - 1) \times 2$ quantizing levels exist. Among these, $(2^k - 2)$ levels at the origin side are encoded by k bits, residual $2^k$ levels are encoded by $(2^k - 1)$ bits. In encoding of $(2^k - 1)$ bits, upper k bits are bits to command changing of sign bit and code length, and lower $(k - 1)$ bits indicate $2^{k-1}$ quantizing levels at either positive or negative side.

Figure 19B:
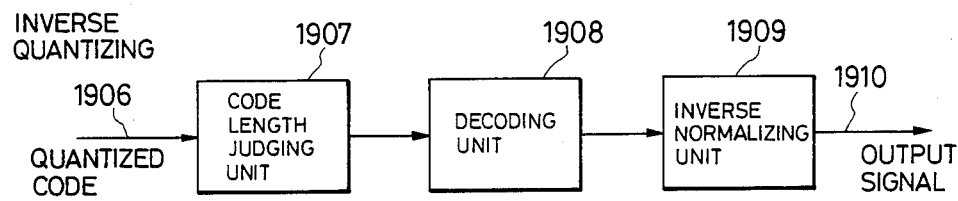

Inverse quantizing will be described referring to FIG. 19(b). An inverse quantizer comprises a code length judging unit 1907, a decoding unit 1908, and an inverse normalizing unit 1909. In the code length judging unit 1907, k bits of the quantized code input 1906 are read, and judging is performed regarding whether these bits are bit series to indicate abnormal value (for example; S11 . . . 1) or not. If so, subsequent (k-1) bits of the quantized code 1906 are read. In the decoding unit 1908, k-bit codes corresponding to normal value or (2k−1) bit codes corresponding to abnormal value are decoded using the code table, thereby normalized output values are obtained. In the inverse normalizing unit 1909, following inverse normalizing $$f' = \sigma \cdot f_N'$$

is performed, and output signal f' (1910 in FIG. 19(b)) is obtained. Wherein $f_N'$ is decoded value before the inverse normalizing.

According to the embodiment, $(2^k - 1) \times 2$ quantizing levels obtained by adding quantizing levels corresponding to abnormal value can be encoded by mean bit number $\bar{k}$ $$\begin{aligned}\bar{k} &= (1-p) \times k + p \times (2k-1) \\ &= k + p(k-1)\end{aligned}$$

p is generation probability of the abnormal value. If this value is assumed 0.05, it follows that $$\bar{k} = 1.05k - 0.05$$

Thus quantizing level corresponding to abnormal value can be additional set by increase of code length in negligible amount in comparison to the bit number k in the prior art.

Although uniform distribution is assumed regarding distribution of abnormal value in the embodiment, Laplace distribution, Cauchy distribution or the like may, of course, be assumed.

Next, a fourth embodiment of the invention will be described.

Figure 23:
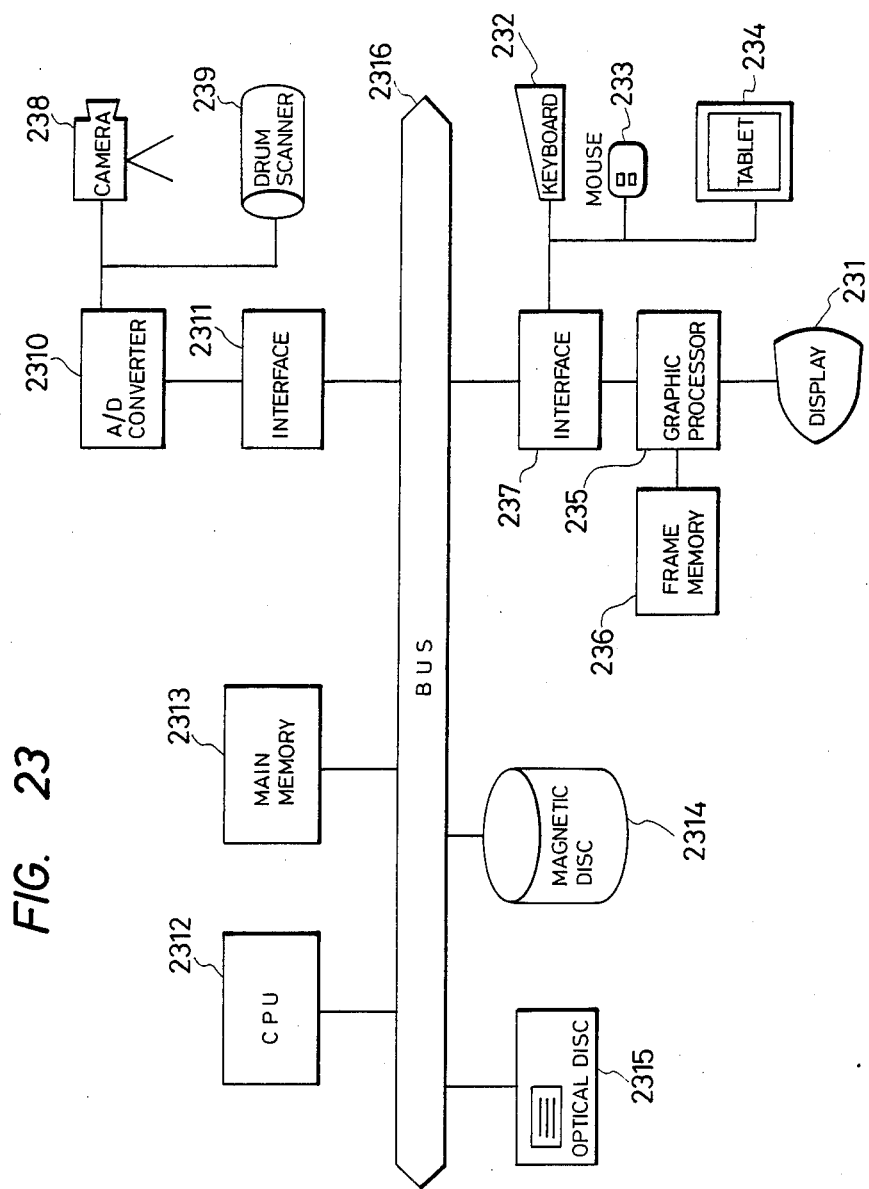
FIG. 23 is a device constitution diagram of a fourth embodiment of the invention.

FIG. 23 is a device constitution diagram of the fourth embodiment of the invention. Seeing representation on a display 231 for image display, region assignment is performed using any one of a keyboard 232, a mouse 233, a tablet 234. In a graphic processor 235 and a frame memory 236, discrimination is performed regarding whether a specific picture element is within the region or not.

A camera 238 for image input, a drum scanner 239, A/D converter 2310, bus interfaces 237 and 2311, CPU 2312, a main memory 2313, a magnetic disc 2314 for image data storage, an optical disc 2315 and the like are connected through a bus 2316.

Figure 24:
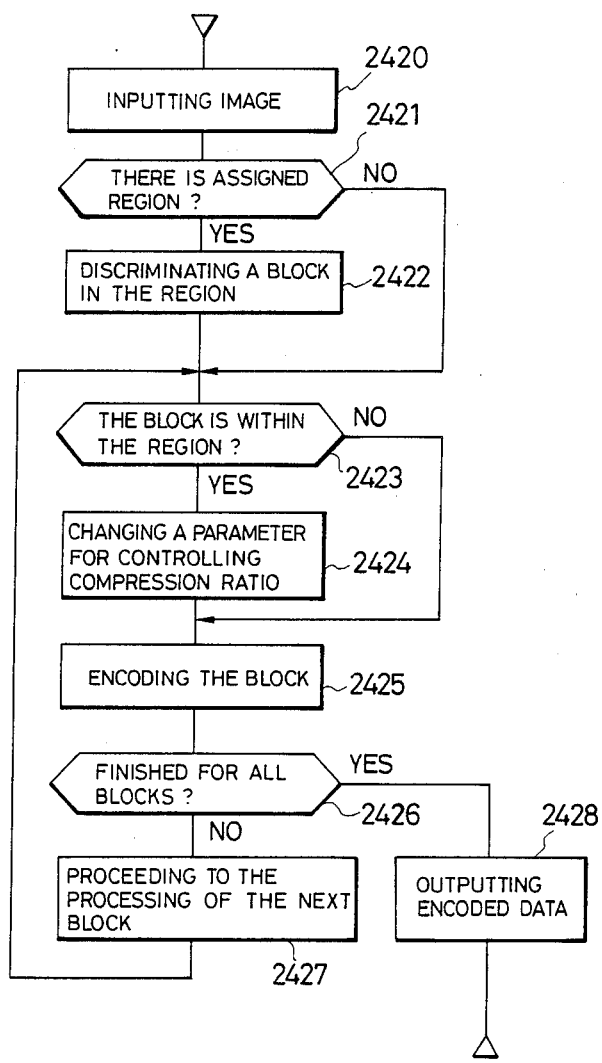
FIG. 24 is a flow chart of coding in the embodiment.

Encoding operation will be described referring to a flow chart of FIG. 24. In processing block 2420, image data is called from the image input members 238, 239 or the image storage members 2314, 2315 onto the frame memory 236, and displayed on the display 231. In processing block 2421, discrimination is performed regarding whether there is assigned region or not. The image is divided into small blocks of (16 picture elements)×(16 picture elements) for example, and encoded. When there is assigned region, in processing block 2422, discrimination is performed regarding whether each block is inside or outside of the region. The discrimination will be described in detail later. In processing block 2423, depending on the study block as encoding object being within the region or not, branch of subsequent processing is performed. In processing block 2424, when the study block is within the region, value for low compression ratio is set in a parameter for controlling compression ratio. If the study block is outside the region and does not pass through the processing block 2424, default value specified for high compression ratio is used. For example, when cosine transform encoding ratio (refer to the above-mentioned known example) is used, concrete form of the parameter for controlling compression ratio becomes as follows.

$$b_{uv} = \log_2 \sigma_{uv} - \log_2 D \quad (49)$$

wherein $b_{uv}$: assigned bit number to (u, v) element of transform coefficient $\sigma_{uv}$: standard deviation of (u, v) element of transform coefficient D. parameter for controlling compression ratio In formula (49), for example, if D=1 encoding at low compression ratio is performed, and if D=8 encoding at high compression ratio is performed. In this case, the assigned bit number in the former becomes more than that in the latter by 3 bits per each element. After the parameter for controlling compression ratio is set, in processing block 2425, encoding at block unit is performed. In processing block 2426, discrimination is performed regarding whether encoding for all blocks is finished or not. If not finished, in processing block 2427, process is advanced to next block. If the encoding for all blocks is finished, in processing block 2428, encoded data is outputted to the storage member 2314 or 2315. The encoded data is provided with a label of one bit representing that each block is within the region or not.

In the above-mentioned processing, control and operation are performed by the CPU 2312 except for the discrimination in the processing block 2422. Regarding the processing block 2422, the graphic processor 235 performs processing as hereinafter described in detail referring to FIGS. 25-27.

Figure 25:
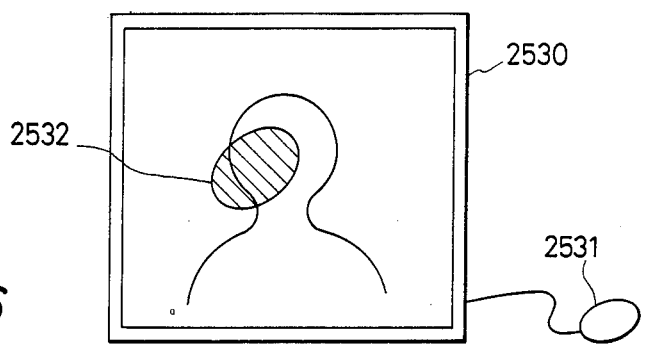
FIG. 25 is a diagram illustrating region assignment system.
Figure 26:
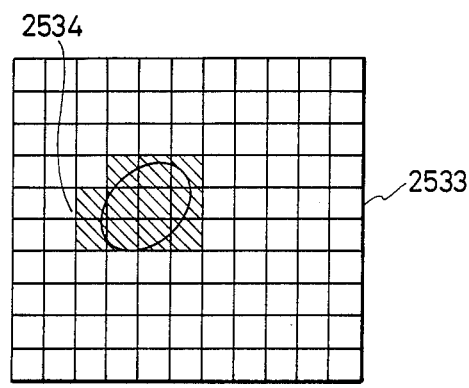
FIG. 26 is a diagram illustrating a block in the region.
Figures 27A, 27B, 27C:
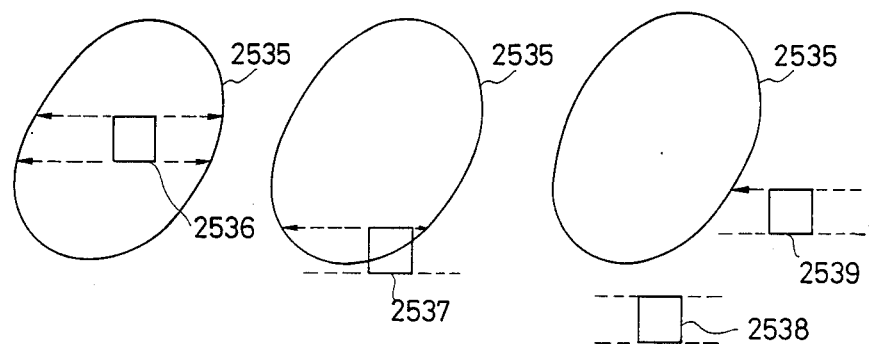
FIG. 27a-c is a diagram illustrating block discrimination system in the region.

In FIG. 25, a region 2532 having useful information is assigned to an image displayed on a display 2530 using a region assigning means (e.g., mouse) 2531. As shown in FIG. 26, an image 2533 is divided into blocks and encoded, and the blocks are classified into two sorts, that inside the region and that outside the region. The block inside the region shall includes not only a block which is really contained within the region but also a block which intersects the region border line. In the example of FIG. 26, the block inside the region becomes a hatching portion 2534. If the region is assumed convex domain, discrimination regarding whether a block is contained within the region or not is performed as follows. To each of four apexes of the block, line passing through the apex and being in parallel to the horizontal side of the block is drawn, and intersection between the line and the region border is detected. Regarding at least one of the four apexes, if two intersection points appear on both sides of the apex (FIG. 27(a), (b)), the block is discriminated as a block inside the region. Regarding any of the four apexes, if two intersection points do not appear on both sides of the apex (FIG. 27(c)), the block is discriminated as a block outside the region.

Figure 28:
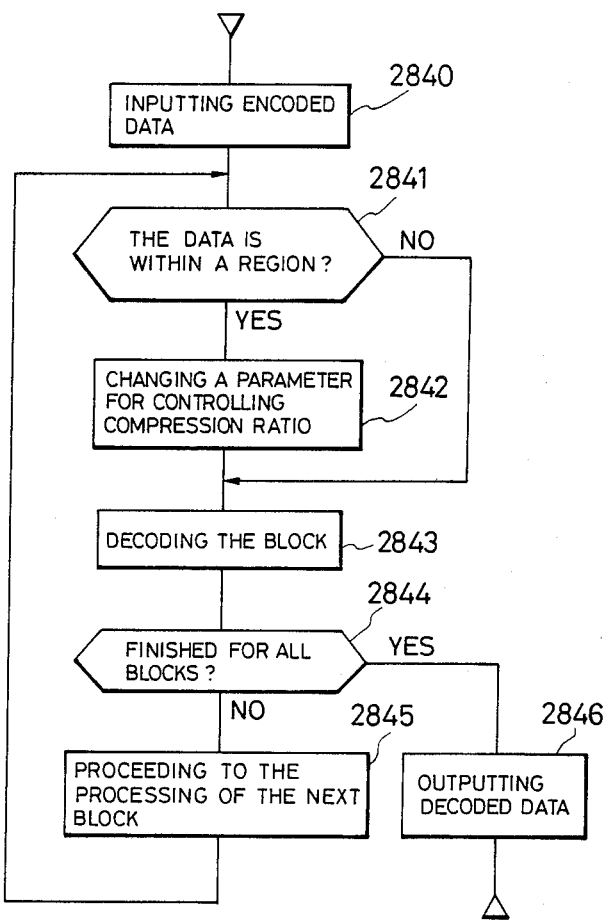
FIG. 28 is a flow chart of decoding in the embodiment.

Decoding operation will be described referring to a flow chart of FIG. 28. In processing block 2840, encoded data from the storage means 2314 or 2315 is read onto the main memory 2313. In processing block 2841, according to a label of one bit representing that a block as decoding object is inside the region or outside the region, branch of subsequent processing is performed. In processing block 2842, when the study block is within the region, value for low compression ratio is set in a parameter for controlling compression ration. If the study block is not within the region, default value for high compression ratio is used. In processing block 2843, the block is decoded. In processing block 2844, discrimination is performed regarding whether decoding for all blocks is finished or not. If not finished, in processing block 2845, process is advanced to next block. If finished, in processing block 2846, decoded image is outputted to the frame memory 236.

Although the embodiment has been described regarding the case that the magnetic disc or the optical disc is used as storage means, it can be also applied to a portable type storage means such as IC card or laser card.

Finally, a fifth embodiment of the invention will be described.

Figure 29:
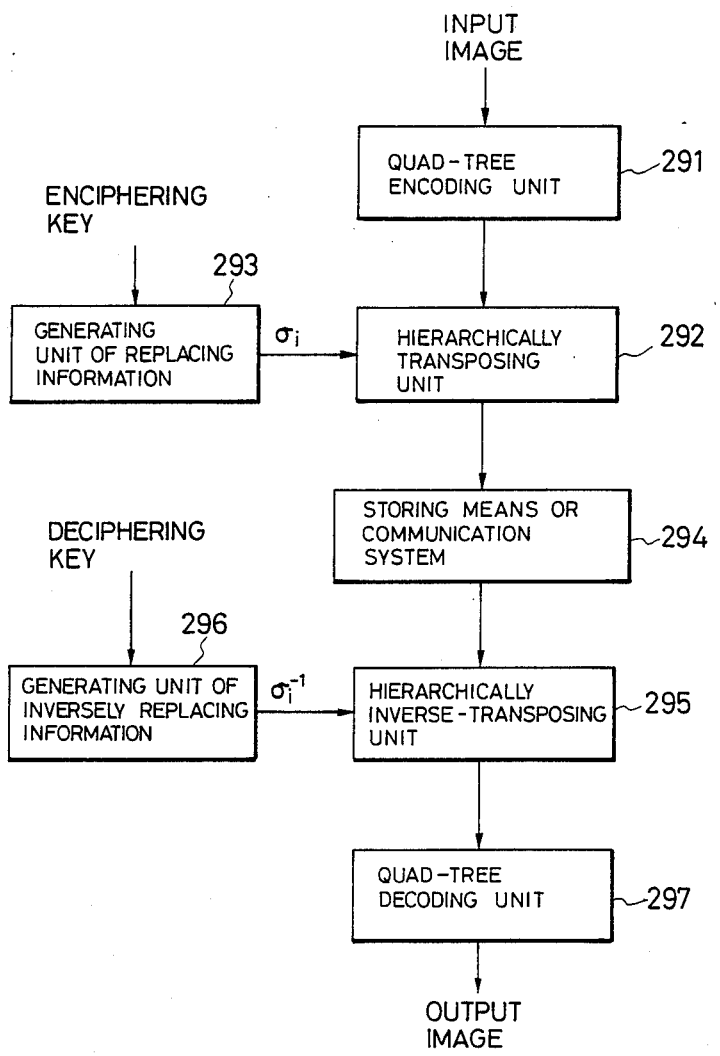
FIG. 29 is a block diagram of device executing a fifth embodiment of the invention.

FIG. 29 is a block constitution diagram of the invention based on quad-tree coding method.

Figures 30A, 30B:
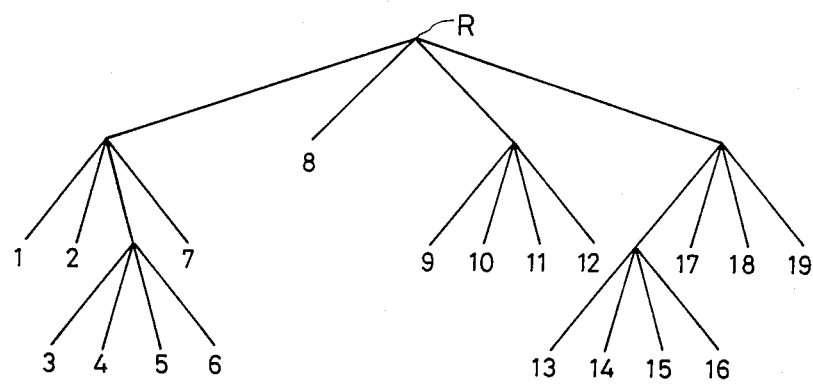
FIG. 30a-b is a model diagram illustrating Quad-Tree coding method.

A quad-tree encoding unit 291 converts input image data into quad-tree encoding data. Quad-tree coding mechanism itself is known well, and disclosed, for example, in "Hirarchical Coding of Binary Images" IEEE Trans. Pattern Analysis and Machine Intelligence, Vol. PAMI-7 No. 3 (May 1985) pp 284–298, or that disclosed in Japanese Patent Application No. 241218/1985 also may be used. Briefly describing, this coding system is in that original image data is divided into 4 corresponding to density or existence of brightness varying points in each part as shown in FIG. 30(a), and a plurality of blocks being different in size are obtained by repeating the dividing, and brightness data in each block is encoded. Degree (number) of dividing into 4 producing a block or a block group is called stage of the block or the block group. For example, in FIG. 30(a), the whole image has stage "0", and a block group of blocks 1–7, a block 8, a block group of blocks 9–12 and a block group of blocks 13–19, produced by the first dividing, have stage "1", and a block 1, a block 2, a block group of blocks 3–6, a block 7 and the like, produced by the second dividing, have stage "2", and further a block 3, a block 4, a block 5, a block 6 and the like, produced the third dividing, have stage "3".

A hierarchically transposing unit 292 transposes blocks or block groups in the image data which is quad-tree encoded in each stage except for "0". Rule of transposing in each stage is given by transposing information $\sigma_i$ which a generating unit 293 of replacing information produces based on an enciphering key. Output of the hierarchically transposing unit is enciphering image data, which is transmitted to a storing means or communication system, designated by block 294. The storing means mentioned here includes not only an ordinary data storing means but also a data holding means such as laser card or IC card.

Figures 32A, 32B:
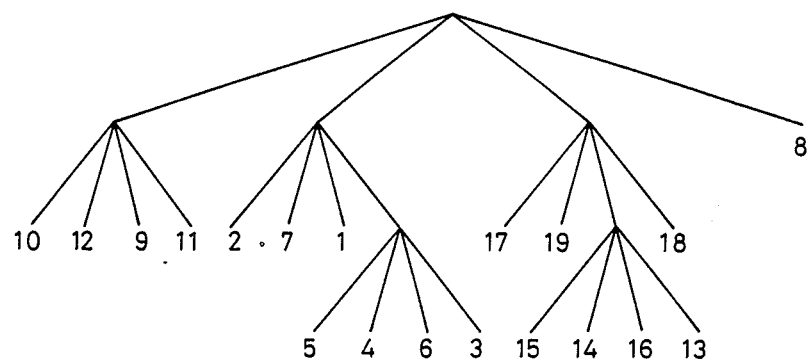
FIG. 32a-b is a model diagram illustrating hierarchical transposing to the quad-tree in FIG. 30.

Decoding of an image data which is quad-tree encoded as shown in FIG. 30 will be described in detail as an example. The block structure of FIG. 30(a) can be represented by quad-tree structure shown in FIG. 30(b). Leaves of the quad-tree have one-to-one correspondence to blocks 1–19. The root node R has stage "0", and stage value of each node increases by "1" towards the end. To each stage i (i=1, 2, . . . ) in such stage structure, replacing:

$$\sigma_i = \begin{pmatrix} 1 & 2 & 3 & 4 \\ i_1 & i_2 & i_3 & i_4 \end{pmatrix}$$

is assigned, and according to this node belonging to the stage i (block or block group in FIG. 30(a)) is transposed. For example, when replacing $\sigma$ shown in FIG. 31(a) is given to some stage, 4 nodes of this stage having the same parent node are transposed in that node in the first position is transferred to the third position, node in the second position is transferred to the first position, and so forth shown in FIG. 31(b). The transposing of node corresponds to transposing of block shown in FIG. 31(c). To stages "1" through "3" in the quad-tree structure of FIG. 30(b) respectively, replacing:

$$\sigma_1 = \begin{pmatrix} 1 & 2 & 3 & 4 \\ 2 & 4 & 1 & 3 \end{pmatrix}$$

$$\sigma_2 = \begin{pmatrix} 1 & 2 & 3 & 4 \\ 3 & 1 & 4 & 2 \end{pmatrix}$$

$$\sigma_3 = \begin{pmatrix} 1 & 2 & 3 & 4 \\ 4 & 2 & 1 & 3 \end{pmatrix}$$

is assigned and transposing is performed. FIG. 32(a) shows a result of the transposing, and FIG. 32(b) shows a result of transposing of a block or a block group corresponding to this. That is, the image data of FIG. 30(a) is subjected to transposing based on the replacing $\sigma_1$–$\sigma_3$ by the hierarchically transposing unit 292, and made image data in arrangement shown in FIG. 32(b). This is enciphered image data.

Information representing replacing $\sigma_i$ for each stage is supplied to the hierarchically transposing unit 292 by the generating unit 293 of replacing information based on the enciphering key. The enciphering key may be the replacing $\sigma_i$ itself or code having one-to-one correspondence thereto. In this case, the generating unit 293 of replacing information transfers the input information as it is or after decoding to the hierarchically transposing unit 292. In such transferring, however, control of the enciphering key is not easy when the stage number becomes large. In order to solve this problem, pseudo-random number generating means may be used and a series of hierachically replacing information may be produced from a shorter enciphering key. For example, in the case of quad-tree, since the number of replacing in each stage becomes 4=24, these are coded by numeric characters from "1" through "24". Suitable numeral is adopted as enciphering key, and pseudo-random number is produced by the stage number in range from 1 through 24 by the known M-series. In the case of image of 512×512 pixcell, since $2^9$=512, 9 pieces of random number may be produced. The random number series obtained in such manner is deemed as replacing code series and decoded in sequence, thereby the replacing information for each stage can be obtained in sequence.

Decoding can be achieved by using inverse replacing:

$$\sigma_i^{-1} = \begin{pmatrix} i_1 & i_2 & i_3 & i_4 \\ 1 & 2 & 3 & 4 \end{pmatrix}$$

in place of each replacing $\sigma_i$. For example, inverse replacing of $\sigma_1$ is $$\sigma_1^{-1} = \begin{pmatrix} 2 & 4 & 1 & 3 \\ 1 & 2 & 3 & 4 \end{pmatrix} = \begin{pmatrix} 1 & 2 & 3 & 4 \\ 3 & 1 & 4 & 2 \end{pmatrix}$$

The deciphering key may be inversely replacing key itself or code thereof. Since the replacing and its inverse replacing have one-to-one correspondence, the deciphering key may be the same as the enciphering key.

A generating unit 296 of inversely replacing information, based on a deciphering key, supplies information representing inverse replacing to the replacing information for each stage used during encoding to a hierarchically inverse-transposing unit 295. If information representing the reverse replacing is given as the deciphering key, the generating unit 296 of inversely replacing information is entirely the same as the generating unit 293 of replacing information. If the deciphering key is the same as the enciphering key, the generating unit 296 of inversely replacing information is the same as the generating unit 293 of replacing information except that the replacing information or code is converted into the inversely replacing information or code. The hierarchically inverse-transposing unit 295 applied the inverse transposing in the hierarchically transposing unit 292 to the received encoded image data so as to obtain the original quad-tree encoding data. However, the transposing unit 292 and the inverse-transposing unit 295 are the same in constitution itself. Output of the hierarchically inverse-transposing unit 295 is decoded by a quad-tree decoding unit 297. The quad-tree encoding unit 291, the hierarchically transposing unit 292 and the generating unit 293 of replacing information can be realized by a single processor suitably programmed. Similar condition applies to the hierarchically inverse-transposing unit 295, the generating unit 296 of inversely replacing information and the quad-tree decoding unit 297.

Even if the data is unfairly read or intercepted from the storing means or communication system 294, the original image cannot be obtained as long as the deciphering key is not known. When an image of 512×512 pixcell is quad-tree encoded, since the number of permutation of the replacing becomes as many as $$(4!)^9 \approx 2.6 \times 10^{12}$$

and evaluation of the image must be helped by human recognition function, sufficient secrecy in practice can be obtained.

In the quad-tree encoding system adopted in the embodiment, encoding data of blocks is carried only by corresponding leaves of the quad-tree. However, the invention can be applied also to tree encoding system where encoding data is carried not only by leaves but also by nodes (branch nodes). In such encoding system, brightness data obtained by decoding the encoded data of the parent node is subtracted from the image data of corresponding block and then dividing into 4 is performed, and 4 sub-blocks obtained by the dividing are encoded and these are made the encoded data of corresponding nodes. Since this encoding system also utilizes the quad-tree structure, the hierarchical transposing can be applied to the quad-tree structure and be enciphered.

The invention can be also applied to tree encoding system where the branch number is other than 4. For example, hierarchical transposing for bi-tree encoding system can be defined by following replacing.

$$\sigma_i = \begin{pmatrix} 1 & 2 \\ i_1 & i_2 \end{pmatrix}$$

According to the invention as above described, following effects are obtained.

(1) A data encoding method can be realized wherein when numerical data in two-dimensional distribution is to be encoded, not only the local redundancy of the distribution but also the global redundancy can be suppressed and compressed.

Particularly, when the invention is applied to compression encoding of the image data, the data compression of high degree becomes possible. Moreover, bit distribution based on the human vision property is performed, thereby the compression ratio can be improved without feeling the deterioration of the picture quality.

(2) The block dividing form is made variable depending on state of brightness variation, and the gently varying region occupying major part on the image is roughly block-divided and encoded by small code amount, thereby the compression performance is improved. Portion of sharp line or edge is finely block-divided and its shape is accurately held, but large distortion is allowed and the quantizing bit number is reduced, thereby fading in the sharp line or edge can be avoided without much increasing the code amount. In comparison with adaptive cosine transform encoding system having high compression performance in conventional system, SN ratio of the decoded image at the same compression ratio is improved by about 0-3 dB (different by image), and fading in the line or edge is little.

Since the brightness varying state is reflected to the block dividing structure, simple function such as bi-linear function can be utilized for the block encoding, thereby the encoding/decoding processing time is decreased. Regarding the decoding processing time particularly becoming a problem in practice, as a result of simulation to the image of 512×512 size, the time becomes about 1/10 of the adaptive cosine transform system.

(3) In signal processing system of picture, voice or the like, where input signal approximately follows specific distribution (e.g., Gaussian distribution) but abnormal value (e.g., 3 $\sigma$ or more) occurs frequently (e.g., several %) and therefore increase of the mean quantizing error becomes a problem, the quantizing according to the invention is robust against generation of the abnormal value, that is, can prevent increase of the mean quantizing error without increasing the mean code length in comparison to a quantizer in the prior art.

(4) Since quantizing can be performed so that portion inside the specific region on the image and portion outside the region are different in compression ratio, the compression ratio is decreased in the region including useful information thereby the information reservation of high degree is performed, and the compression ratio is increased outside the region thereby the quantizing data amount is decreased.

(5) Transposing is added to the tree coding for the image compression, thereby enciphering can be achieved and the image compression effect of the tree encoding can be maintained. Accordingly, the enciphering system to enable the efficient storage/transmission of the image data can be realized at low cost.

What is claimed is:

1. Data coding method wherein image data is divided into blocks, said method comprising the steps of:
dividing the image data into blocks being not equal in length and in number of picture elements depending on an amount of variation of brightness;

converting brightness within the divided blocks into data corresponding to an apex of each block using an approximation by a bi-linear function; and encoding the converted data into tree-structure data;

wherein data within the divided blocks is encoded into tree-structure data so that an index of distortion after encoding/decoding processing is not over a tolerable value;

wherein a total sum of a square error of a function of approximating the brightness variation within each block and a difference brightness of each picture element point is used as an index of distortion;

wherein said bi-linear function is used as a function of approximating the brightness variation within a block, and a plurality of coefficients of said bi-linear function are quantized and said quantized coefficients is supplied as encoded data of the block.

2. Data coding method as set forth in claim 1, wherein an assigned bit number during quantizing of said coefficients is determined to be made equal for a block of equal size based on variance of a plurality of coefficients of said block of equal size.

* * * * *